United States Patent [19]
Hasebe et al.

[11] Patent Number: 5,826,129
[45] Date of Patent: Oct. 20, 1998

[54] SUBSTRATE PROCESSING SYSTEM

[75] Inventors: Keizo Hasebe, Kofu; Shinji Nagashima, Kumamoto; Norio Semba, Kumamoto; Masami Akimoto, Kumamoto; Yoshio Kimura, Kumamoto-ken; Naruaki Iida, Kumamoto; Kouji Harada, Kumamoto-ken; Issei Ueda, Kumamoto; Nobuo Konishi, Yamanashi-ken, all of Japan

[73] Assignees: Tokyo Electron Limited, Toyko; Tokyo Electron Kyushu Limited, Tosu, both of Japan

[21] Appl. No.: 496,319

[22] Filed: Jun. 29, 1995

[30] Foreign Application Priority Data

| Jun. 30, 1994 | [JP] | Japan | 6-173510 |
| Aug. 4, 1994 | [JP] | Japan | 6-202717 |
| Jan. 10, 1995 | [JP] | Japan | 7-018680 |

[51] Int. Cl.$^6$ ..................................................... G03D 5/00
[52] U.S. Cl. .......................... 396/611; 396/627; 414/225; 414/416
[58] Field of Search ..................................... 396/604, 611, 396/627; 414/225, 416, 939, 937; 118/666–668, 712, 500

[56] References Cited

U.S. PATENT DOCUMENTS

| 4,855,775 | 8/1989 | Matsuoka | 396/627 |
| 5,442,416 | 8/1995 | Tateyama et al. | 396/627 |
| 5,527,617 | 6/1996 | Graiver et al. | 428/447 |
| 5,555,234 | 9/1996 | Sugimoto | 396/627 |
| 5,651,823 | 7/1997 | Parodi et al. | 396/624 |

FOREIGN PATENT DOCUMENTS

| 1-209737 | 8/1989 | Japan . |
| 4-85812 | 3/1992 | Japan . |

Primary Examiner—D. Rutledge
Attorney, Agent, or Firm—Oblon, Spivak, McClelland, Maier & Neustadt, P.C.

[57] ABSTRACT

This invention provides a substrate processing system including a cassette station on which at least one cassette containing a plurality of objects is placed, a process station including a plurality of process chambers for performing processing for the objects, and an object conveying unit for loading the objects into the process chambers and unloading the objects from the process chambers, a first object transfer unit for transferring the objects between the cassette station and the process station, and an interface section including an object waiting region where the objects wait, and a second object transfer unit for transferring the objects to the process station, wherein the process chambers in the process station are arranged around the object conveying unit, and the object conveying unit has a rotating shaft almost parallel to the vertical direction and can move up and down in the vertical direction along the rotating shaft and rotate about the rotating shaft.

23 Claims, 20 Drawing Sheets

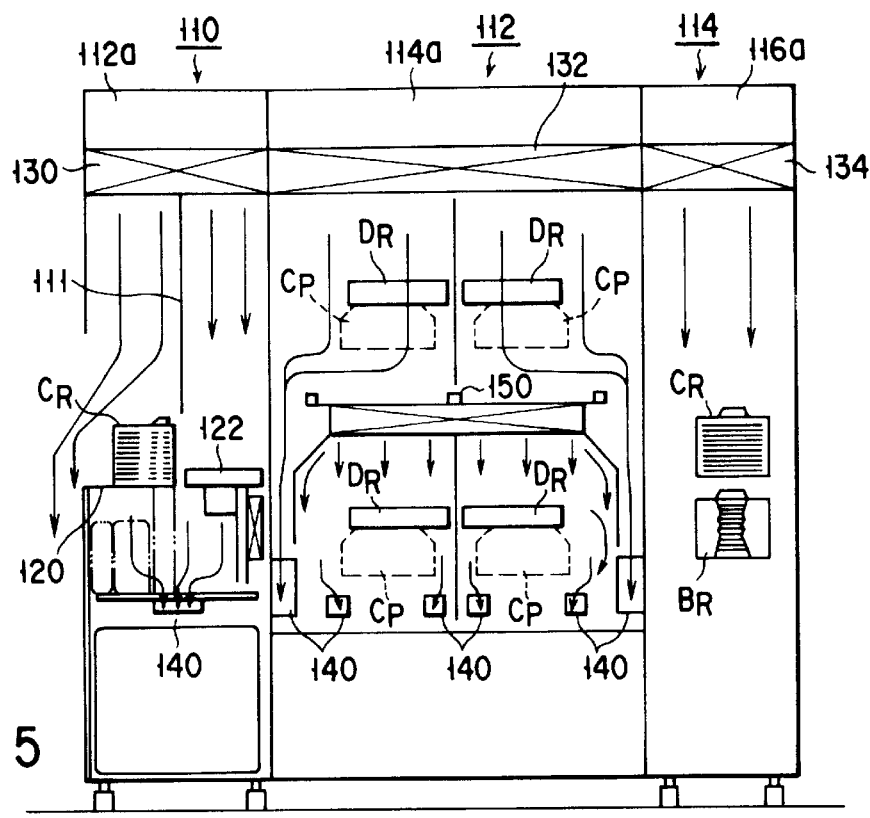
F I G. 5
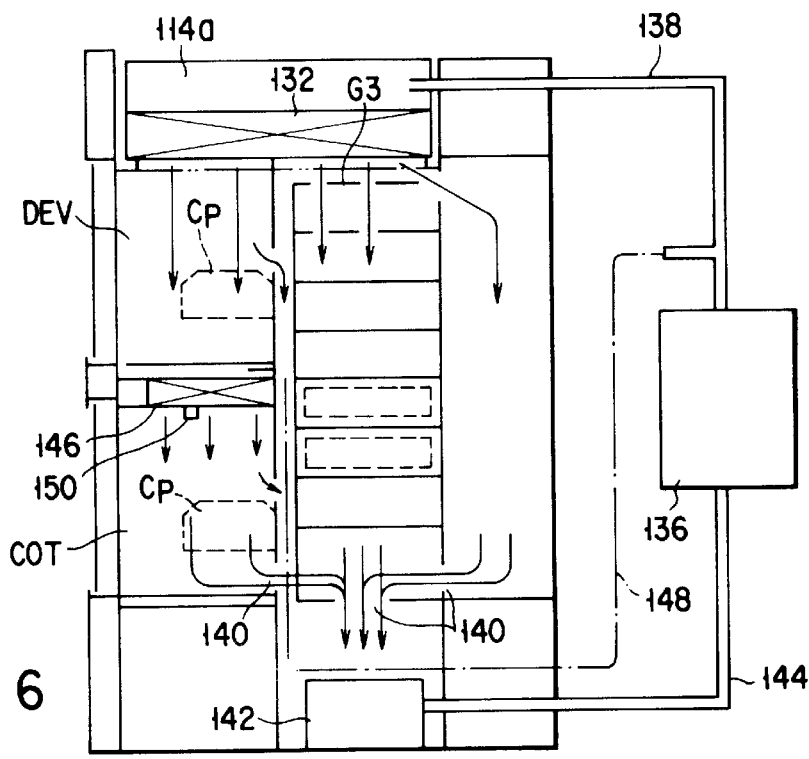
F I G. 6

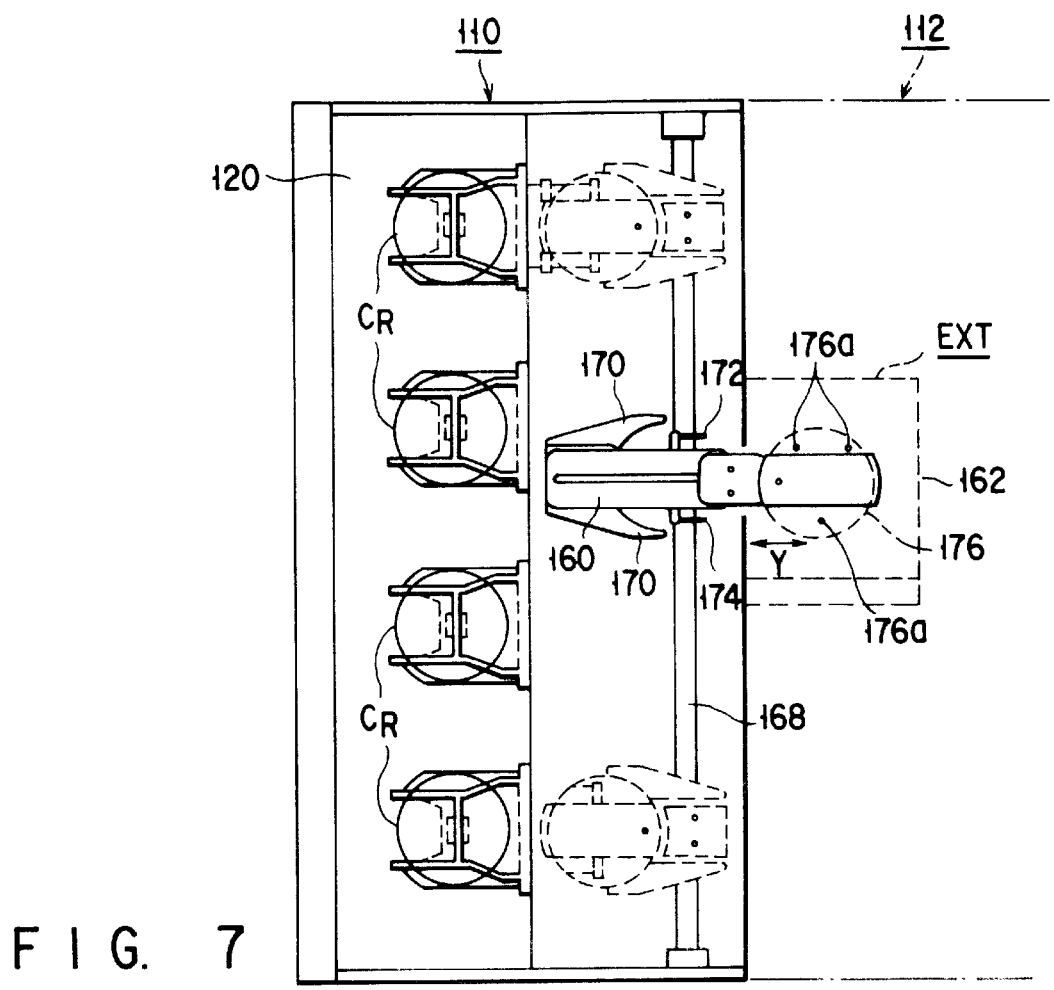
F I G. 7
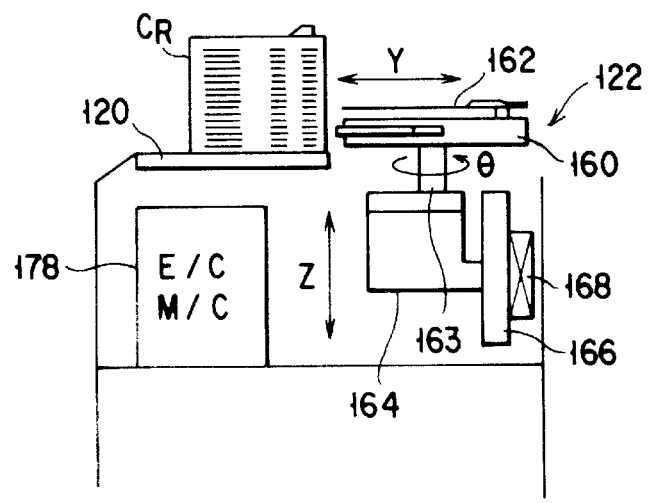
F I G. 8

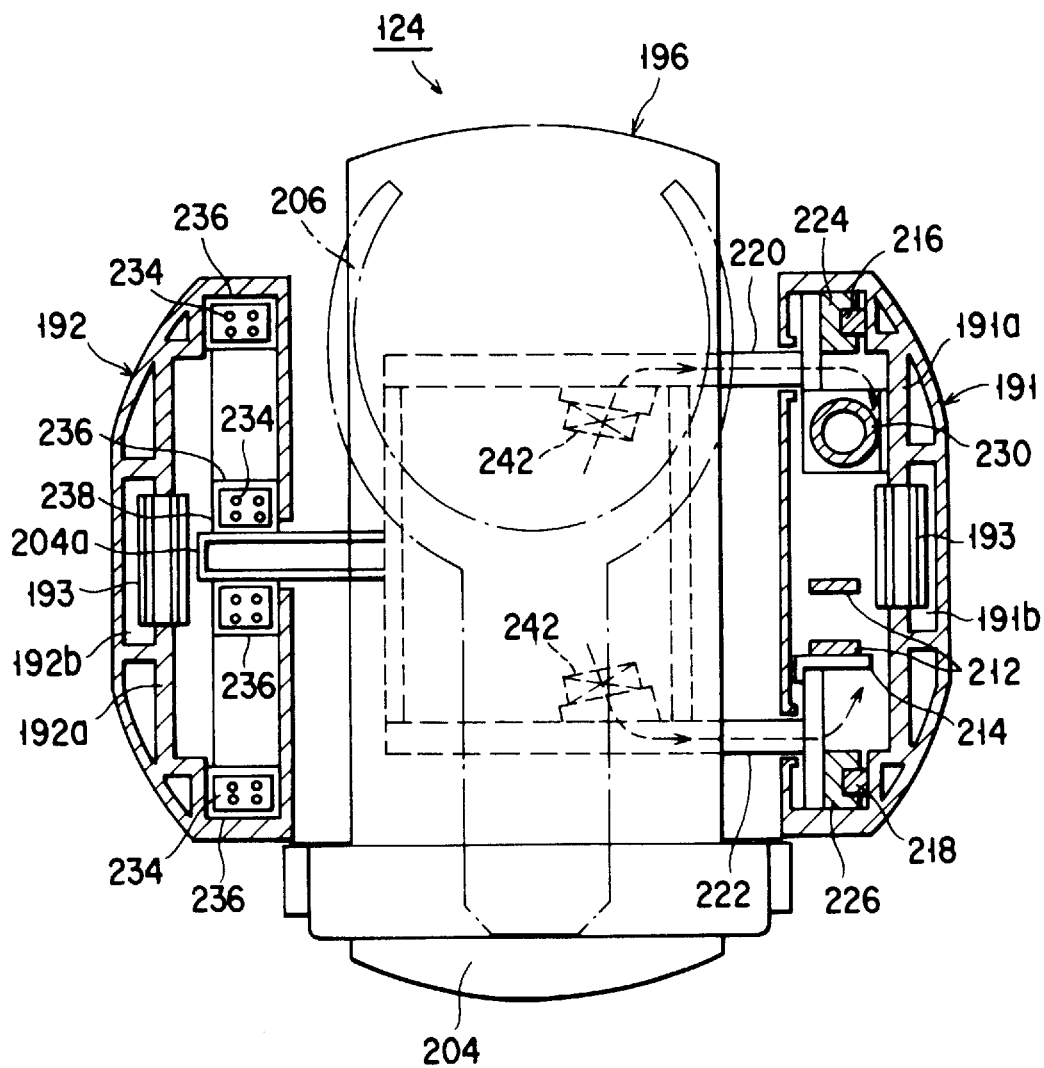
F I G. 13

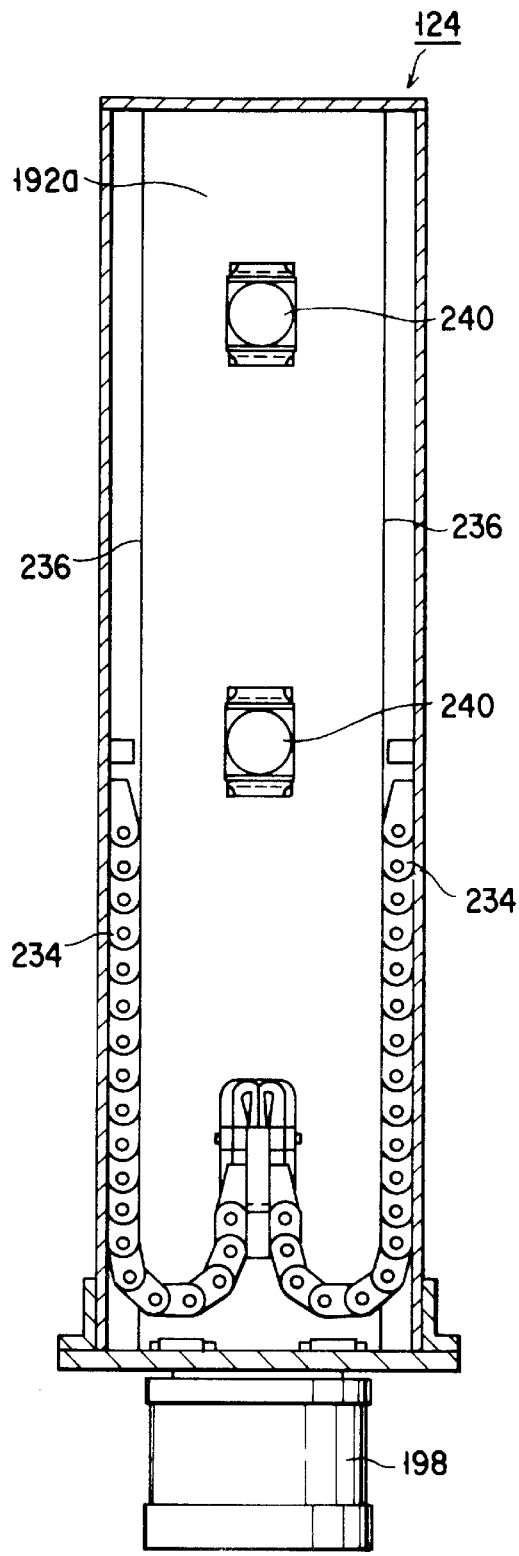
F I G. 15

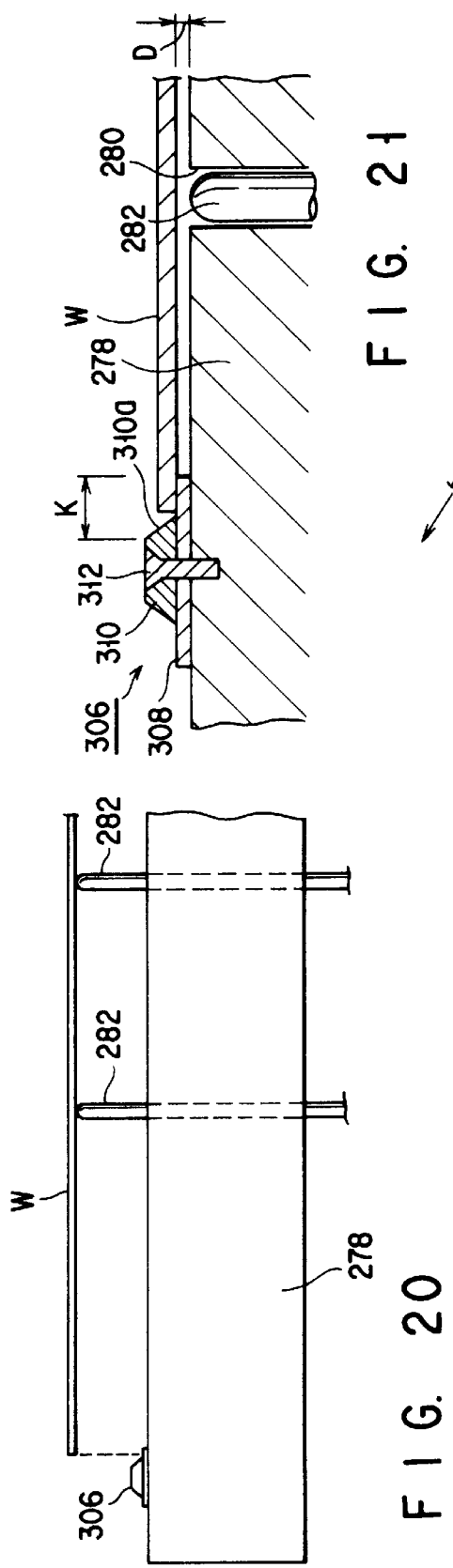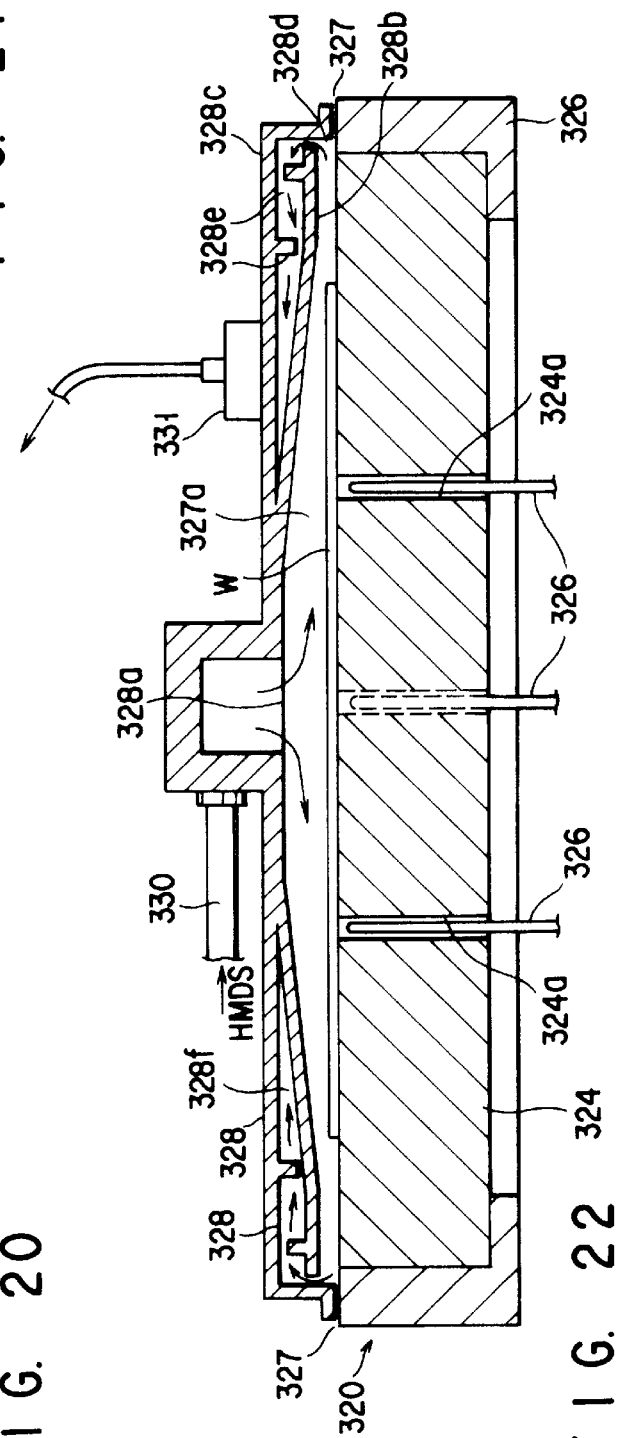

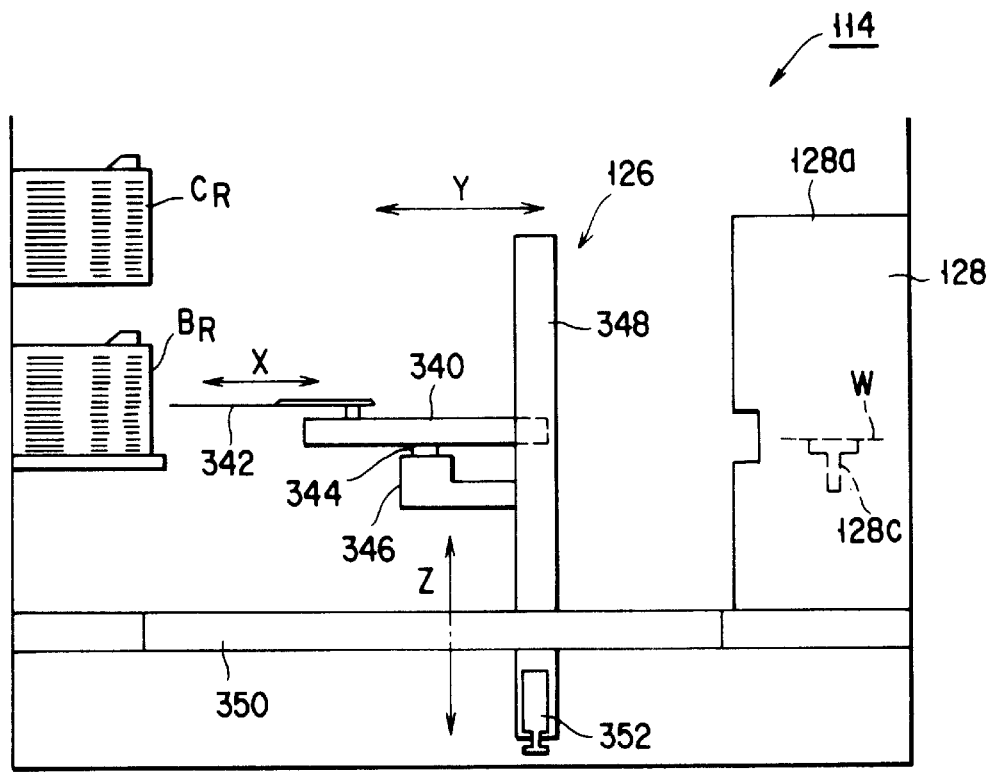
F I G. 23
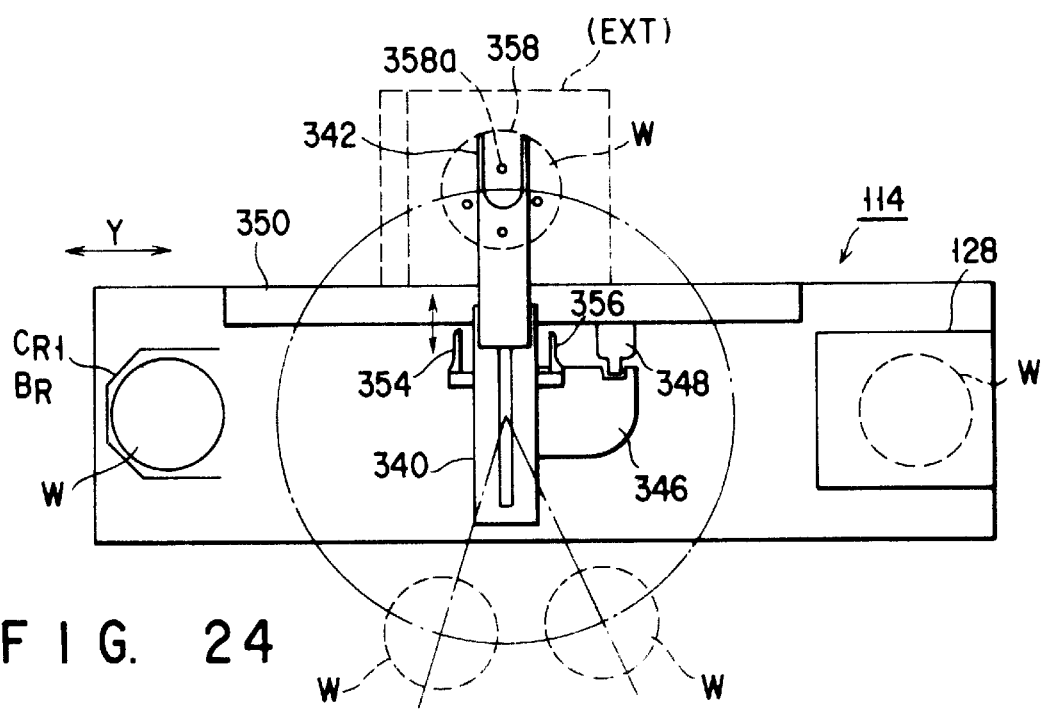
F I G. 24

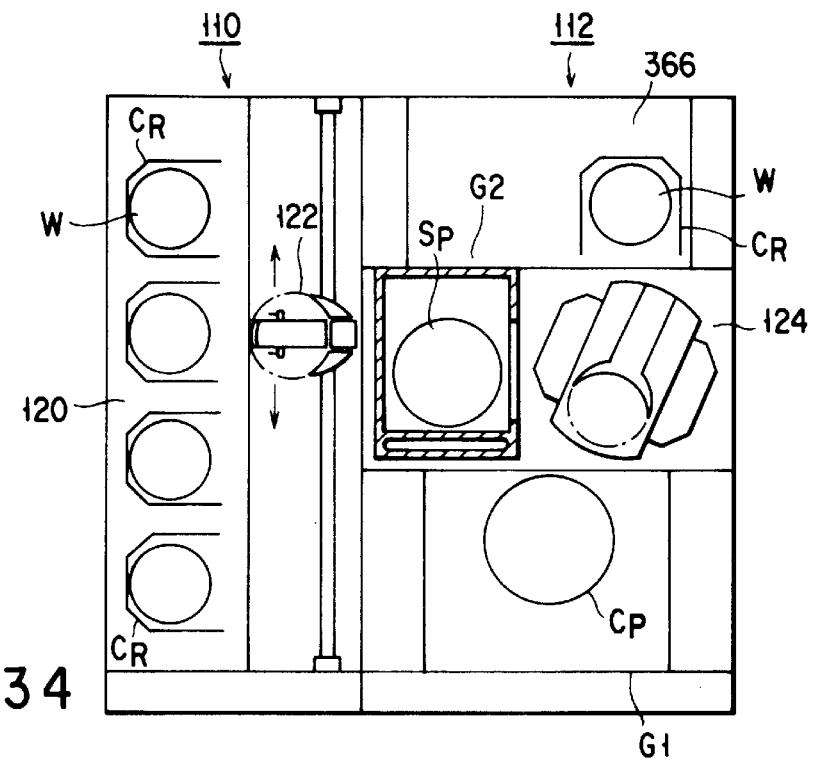
F I G. 34
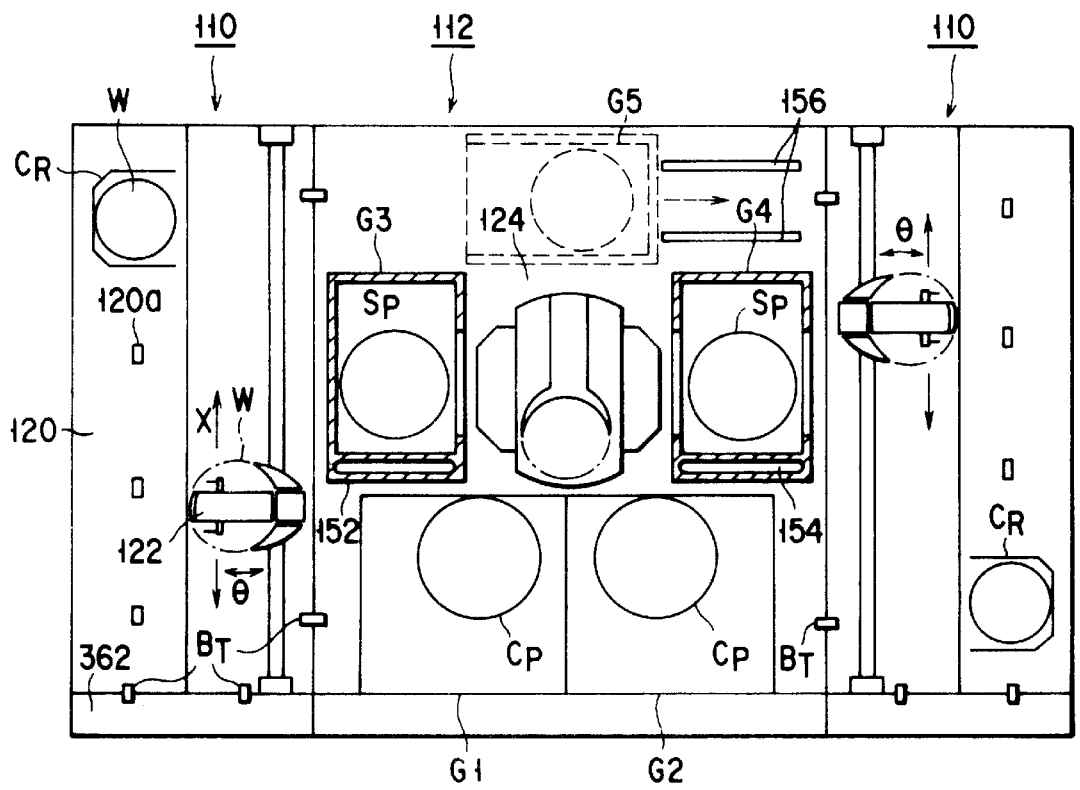
F I G. 35

SUBSTRATE PROCESSING SYSTEM

BACKGROUND OF THE INVENTION

1. Field of the Invention

The present invention relates to a substrate processing system including a series of processing units for processing objects, such as semiconductor wafers (to be abbreviated as wafers hereinafter) or LCD substrates, by single wafer processing.

2. Description of the Related Art

FIG. 1 illustrates a conventional substrate processing system, e.g., a resist coating/developing system used in the manufacture of semiconductor devices. This processing system includes a cassette station 1, a brush cleaning unit 2, a jet water spray 3, adhesion units 4, cooling units 5, a resist coating unit 6, baking units 7, an edge exposure unit 8, a wafer transfer table 9, and a developing unit 10. The cassette station 1 loads and unloads a wafer W as a target object into and from a cassette. The brush cleaning unit 2 cleans the wafer W with a brush. The jet water spray 3 cleans the wafer W with high-pressure jet water. The adhesion unit 4 makes the surface of the wafer W hydrophobic. The cooling unit 5 cools the wafer W to a predetermined temperature. The resist coating unit 6 coats a resist on the surface of the wafer W. The baking unit 7 pre-bakes or post-bakes the wafer W by heating before or after the resist coating. The edge exposure unit 8 removes the resist from the edge of the wafer W. The wafer transfer table 9 performs transfer of the wafer W with respect to a neighboring exposure apparatus (not shown). The developing unit 10 selectively dissolves an exposed portion or an unexposed portion of the resist by bringing a developing solution into contact with the exposed wafer W. This conventional processing system aims at improving the work efficiency by integrally, intensively arranging these units.

In this processing system, a wafer convey path 11 is formed in the longitudinal direction between the two unit rows. The units 2 to 10 are so disposed that their wafer entrances face the wafer convey path 11. A wafer convey member 12 for conveying the wafer W to the units 1 to 9 moves along the wafer convey path 11.

The above processing system is long sideways since the processing units 2 to 10 are arranged along the convey path 11. This inevitably increases the space occupied by the overall system and also increases the cost of the clean room. Especially when a vertical laminar flow method which is effective for this kind of a processing system is employed to improve the cleanliness of the entire system or of each individual unit, the initial cost and the maintenance cost of an air-conditioner or a filter are exceedingly increased since the space occupied by the system is large as described above.

In addition, to access the units 1 to 9 in the system, the wafer convey member 12 not only linearly moves along the wafer convey path 11 (in the Y direction) but can move in the vertical direction (the Z direction) and rotate (in the θ direction). Also, an arm or a pair of tweezers 12a of the wafer convey member 12 is so arranged as to move back and forth (in the X direction) in transferring the wafer W. That is, the wafer convey member 12 can move in the four axial directions (the X, Y, Z, and θ directions). This complicates the structure of the wafer convey member 12 and restricts the access speed of the member. A member which operates most frequently in a system of this sort is the wafer convey member 12, so the access speed or the conveying speed of the wafer convey member 12 has an effect on the throughput of the system. The throughput of the processing system described above is limited since the access speed of the wafer convey member 12 is limited.

Furthermore, in the above processing system, the oven-type processing units such as the adhesion units 4 or the baking units 7 are piled up like building blocks. To repair one of these processing units thus piled up, therefore, it is necessary to temporarily remove all of the processing units stacked on the unit of interest. This results in a very cumbersome maintenance work.

SUMMARY OF THE INVENTION

The present invention has been made in consideration of these conventional problems, and has as its object to provide a substrate processing system which decreases the cost of the clean room by greatly decreasing the space occupied by the system, and can improve the throughput by increasing the access speed and the conveying speed.

The above object of the present invention is achieved by a substrate processing system comprising a cassette station on which at least one cassette containing a plurality of objects is placed, a process station including a plurality of process chambers for performing processing for the objects, and object conveying means for loading the objects into the process chambers and unloading the objects from the process chambers, first target object transfer means for transferring the objects between the cassette station and the process station, and an interface section including an object waiting region where the objects wait, and second object transfer means for transferring the objects to the process station, wherein the process chambers in the process station are arranged around the object conveying means, and the object conveying means has a rotating shaft almost parallel to the vertical direction and can move up and down in the vertical direction along the rotating shaft and rotate about the rotating shaft.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention and, together with the general description given above and the detailed description of the preferred embodiments given below, serve to explain the principles of the invention.

FIGS. 5 and 6 are views showing the flows of clean air in the substrate processing system according to the present invention;

FIG. 7 is a plan view showing the arrangement of a cassette station in the substrate processing system according to the present invention;

FIG. 8 is a sectional view showing the arrangement of the cassette station in the substrate processing system according to the present invention;

FIG. 13 is a sectional view taken along the direction of an arrow A in FIG. 12;

FIG. 15 is a sectional view taken along the direction of an arrow C in FIG. 12;

FIG. 20 is a side view showing the arrangement of a wafer guide/support projection in the baking unit of the substrate processing system according to the present invention;

FIG. 21 is a sectional view showing the main part of the wafer guide/support projection in FIG. 20;

FIG. 22 is a sectional view showing the arrangement of an adhesion unit of the substrate processing system according to the present invention;

FIG. 23 is a side view showing the arrangement of an interface section of the substrate processing system according to the present invention;

FIG. 24 is a plan view showing the arrangement of the interface section of the substrate processing system according to the present invention;

FIGS. 33 to 36 are plan views showing other embodiments of the substrate processing system according to the present invention.

DETAILED DESCRIPTION OF THE PREFERRED EMBODIMENTS

In a substrate processing system of the present invention, all multi-stage single wafer processing units are arranged around a target object conveying means, and the target object conveying means is vertically moved and/or rotated. This allows high-speed access to every unit.

One embodiment of the present invention will be described in detail below with reference to the accompanying drawings.

Figure 1:
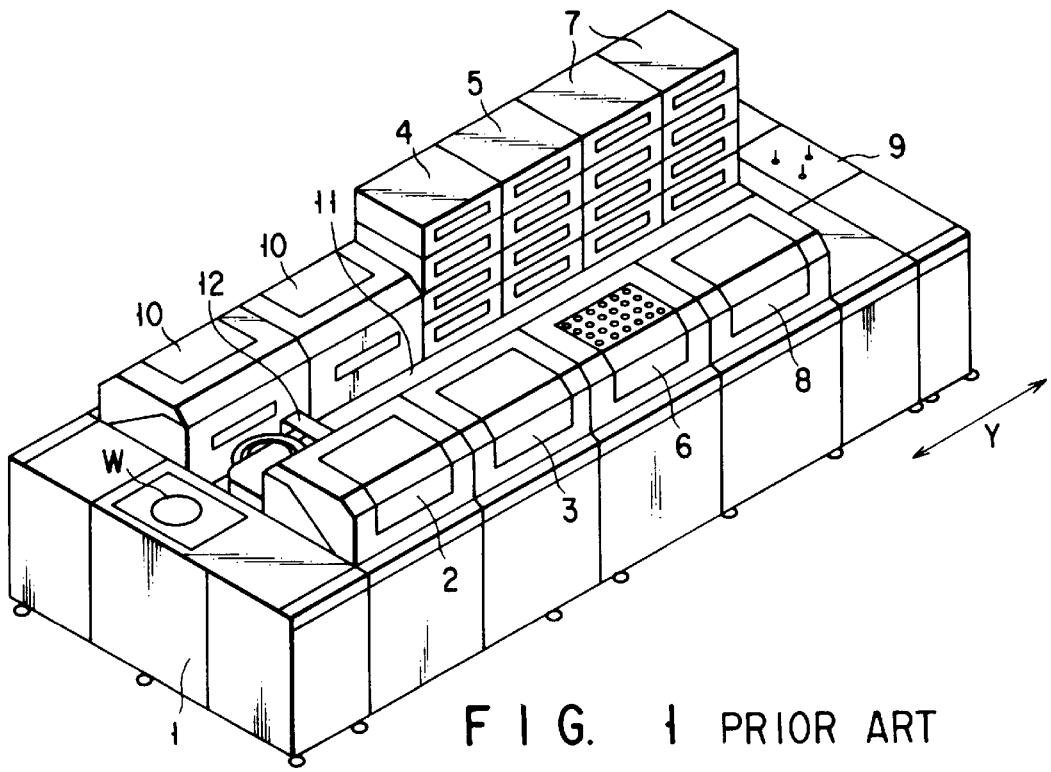
FIG. 1 is a perspective view showing a conventional substrate processing system.
Figure 2:
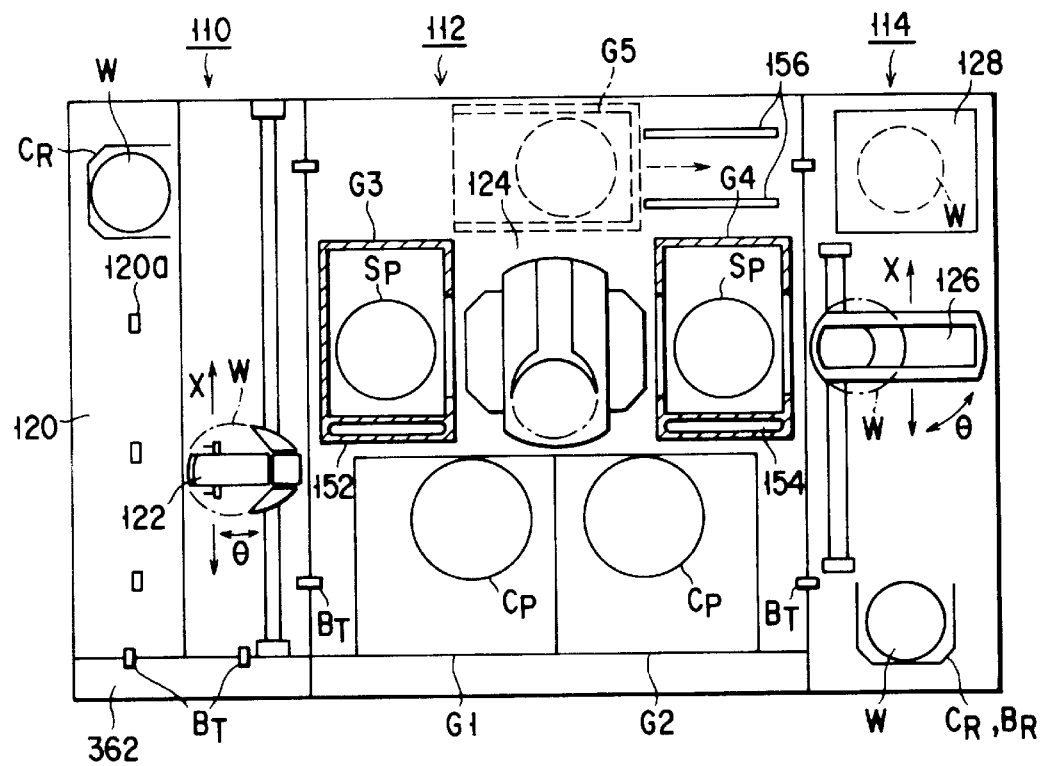
FIG. 2 is a plan view showing the overall arrangement of a substrate processing system according to the present invention.
Figure 3:
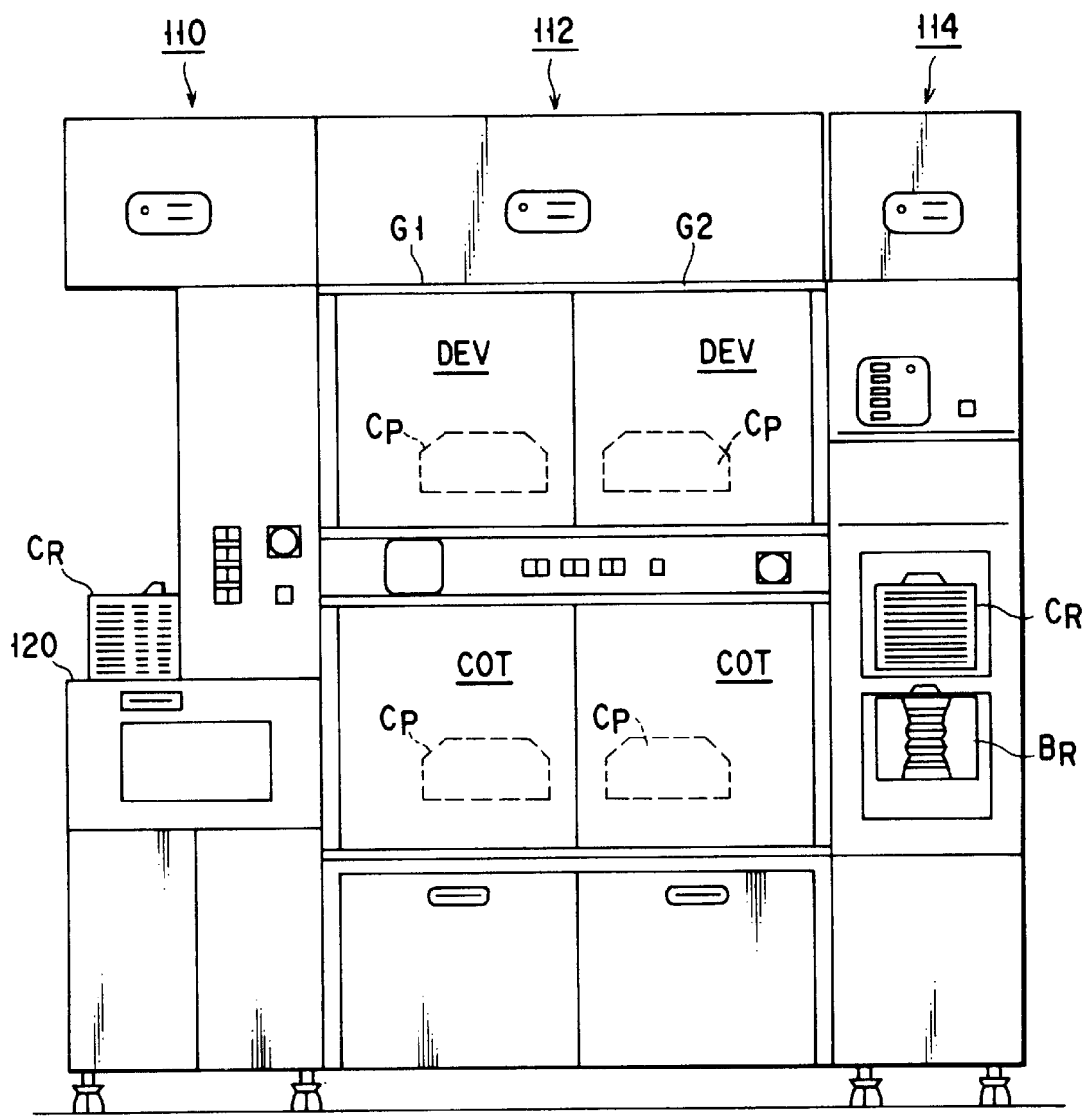
FIG. 3 is a side view showing the overall arrangement of the substrate processing system according to the present invention.
Figure 4:
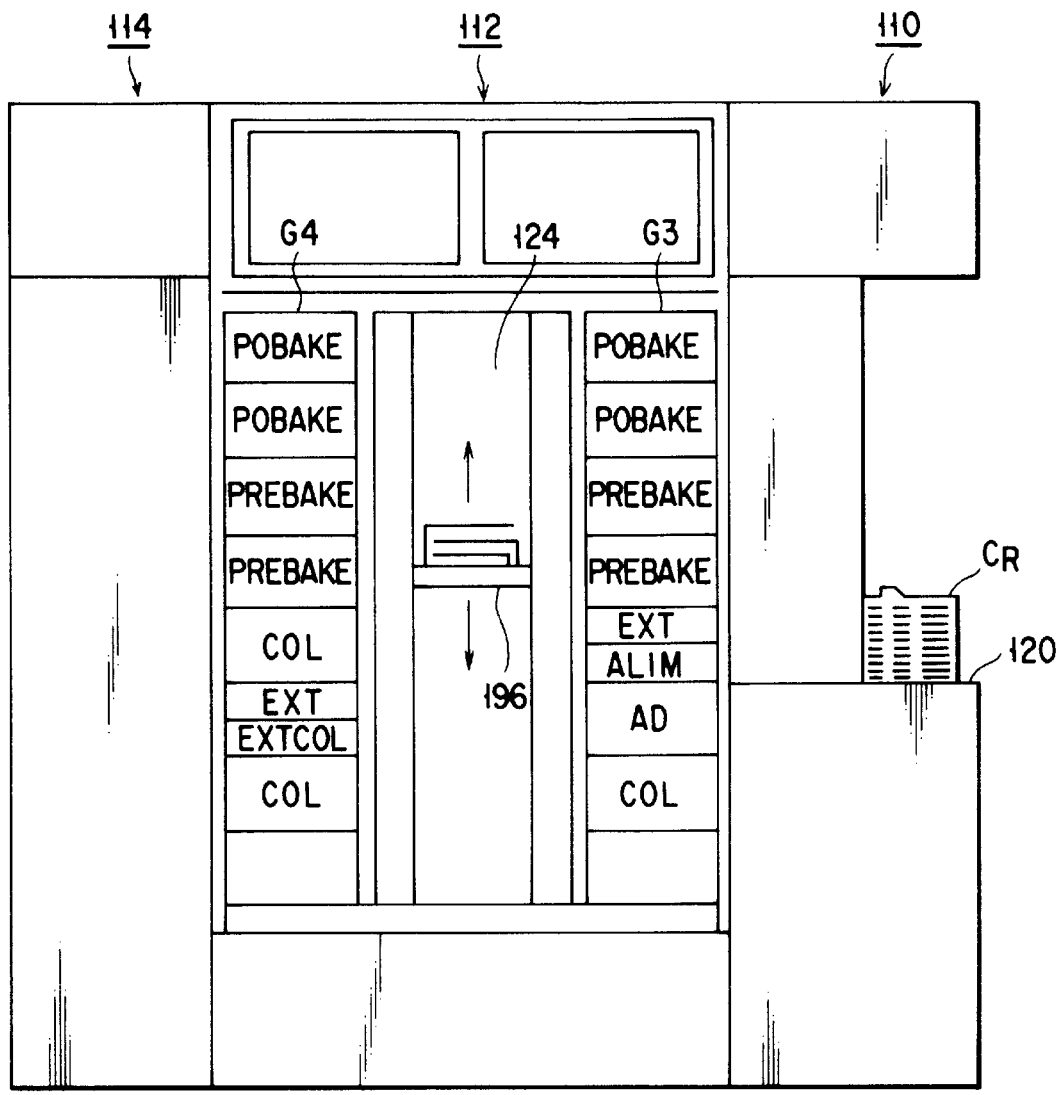
FIG. 4 is a rear view showing the overall arrangement of the substrate processing system according to the present invention.

FIGS. 2 to 4 are views showing the overall arrangement of a coating/developing system according to the present invention. FIGS. 2, 3, and 4 are a plan view, a front view, and a rear view, respectively. This processing system includes a cassette station 110, a process station 112, and an interface section 114. The cassette station 110 loads a wafer cassette CR which contains a plurality of, e.g., 25 wafers W into the system from the outside or unloads the wafer cassette CR from the system. The cassette station 110 also loads/unloads the wafer W into/from the wafer cassette CR. In the process station 112, various single wafer processing units each for performing predetermined processing for the wafers W one by one during the coating and development steps are arranged at their respective predetermined positions. The interface section 114 performs transfer of the wafers W with respect to an exposure apparatus (not shown) located adjacent to the process station 112. The cassette station 110, the process station 112, and the interface section 114 are integrally connected to each other.

As illustrated in FIG. 2, in the cassette station 110, a plurality of, e.g., a maximum of four wafer cassettes CR are arranged in line along the X direction at the positions of projections 120a on a cassette table 120, so that their respective wafer entrances face the process station 112. A wafer convey member 122 (a first target object transfer means) capable of moving in the direction (the X direction) along which the cassettes are arranged and in the vertical direction (the Z direction) selectively accesses the wafer cassettes CR. This wafer convey member 122 is also rotatable in the θ direction. This, as will be described later, allows the wafer convey member 122 to access an alignment unit (ALIM) and an extension unit (EXT) which belong to multi-stage units of a third group $C_3$ in the process station 112.

As in FIG. 2, in a central portion of the process station 112, a wafer convey mechanism 124 is disposed which is a target object conveying means which can move in the vertical direction and rotate. One or a plurality of groups of all multi-stage processing units are arranged around this wafer convey mechanism 124. In FIG. 2, five groups $G_1$, $G_2$, $G_3$, $G_4$, and $G_5$ of multi-stage units are arranged. The multi-stage units of the first and second groups $G_1$ and $G_2$ are juxtaposed on the front side (the lower side in FIG. 2) of the system, and the multi-stage units of the third group $G_3$ are arranged adjacent to the cassette station 110. The multi-stage units of the fourth group $G_4$ are arranged adjacent to the interface section 114, and the multi-stage units of the fifth group $G_5$ are arranged on the rear side (the upper side in FIG. 2) of the system.

As shown in FIG. 3, in the first group $G_1$, two spinner-type processing units, e.g., a resist coating unit (COT) and a developing unit (DEV), each for performing predetermined processing for the wafer W placed on a spin chuck in a cup CP are stacked in the order named from the below. Likewise, in the second group $G_2$, two spinner-type processing units, e.g., a resist coating unit (COT) and a developing unit (DEV), are stacked in this order from the below. The resist coating unit (COT) is preferably arranged in the lower stage as described above, since waste disposal of the resist solution is troublesome both mechanically and in view of maintenance. Note that the resist coating unit (COT) can also be arranged in the upper stage as needed.

As illustrated in FIG. 4, in the third group $G_3$, eight oven-type processing units, e.g., a cleaning unit (COL), an adhesion unit (AD), an alignment unit (ALIM), an extension unit (EXT), pre-baking units (PREBAKE), and post-baking units (POBAKE), each for performing predetermined processing for the wafer W placed on a susceptor SP, are arranged in the order named from the below. Similarly, in the fourth group $G_4$, eight oven-type processing units, e.g., a cleaning unit (COL), an extension cleaning unit (EXTCOL), an extension unit (EXT), a cleaning unit (COL), pre-baking units (PREBAKE), and post-baking units (POBAKE), are arranged in this order from the below.

As described above, the cleaning units (COL) and (EXTCOL) whose processing temperatures are relatively low are arranged in the lower stages, and the pre-baking units (PREBAKE), the post-baking units (POBAKE), and the adhesion unit (AD) whose processing temperatures are relatively high are arranged in the upper stages. This makes it possible to reduce the mutual thermal interference between these units. Note that these multi-stage units can also be arranged in a random manner.

The interface section 114 has almost the same dimension as that of the process station 112 in the direction of depth (the vertical direction in FIG. 2) but is smaller than the station 112 in the widthwise direction (the horizontal direction in FIG. 2). On the front side (the lower side in FIG. 2) of the interface section 114, a portable pickup cassette CR and a stationary buffer cassette BR are stacked. On the rear side (the upper side in FIG. 2) of the interface section 114, an edge exposure device 128 is disposed. A wafer convey member 126 (a second target object transfer means) is provided in the region between the edge exposure device and the cassettes. This wafer convey member 126 moves in the X and Z directions to access the cassettes CR and BR and the edge exposure device 128. The wafer convey member 126 is also rotatable in the θ direction. This allows the wafer convey member 126 to access the extension unit (EXT) which belongs to the multi-stage units of the fourth group $G_4$ in the process station 112 and a wafer transfer table (not shown) of the adjoining exposure apparatus.

Although this processing system is installed in a clean room, the cleanliness of each unit is also increased in the system by using an efficient vertical laminar flow method. FIGS. 5 and 6 show the flows of clean air in the system. Referring to FIGS. 5 and 6, air supply chambers 112a, 114a, and 116a are arranged above the cassette station 110, the process station 112, and the interface section 114, respectively. Filters with a dust removing function, e.g., ULPA filters or chemical filters 130, 132, and 134 are attached to the lower surfaces of the air supply chambers 112a, 114a, and 116a, respectively. As in FIG. 6, an air-conditioner 136 is arranged either outside or behind the processing system and feeds air to the air supply chambers 112a, 114a, and 116a through a pipe 138. Consequently, clean air is supplied by downflow to the stations 110 and 112 and the section 114 through the ULPA filters of the air supply chambers. These downflow air streams are collected into an exhaust port 142 in the bottom through a number of vent holes 140 formed at suitable positions in the lower portion of the system. The collected air is returned to the air-conditioner 136 through a pipe 144.

As shown in FIG. 5, in the cassette station 110, a drop-wall partition 111 partitions the room into the space above the cassette table 120 and the space in which the wafer convey arm 122 moves. Therefore, the downflow air streams individually flow in these two spaces. As in FIGS. 5 and 6, in the process station 112, a ULPA filter 146 is attached to the ceiling surface of the resist coating unit (COT) arranged in the lower stage of the multi-stage units of each of the first and second groups $G_1$ and $G_2$. The air from the air-conditioner 136 is supplied to these filters 146 through a pipe 148 branched from the pipe 138. A temperature-humidity regulator (not shown) is provided midway along the pipe 148 so that clean air at a predetermined temperature and humidity suitable for the resist coating step is supplied to the resist coating units (COT). A temperature-humidity sensor 150 is arranged near the air outlets of the filters 146. Information sensed by the sensor 150 is supplied to a controller of the temperature-humidity regulator. Consequently, the temperature and humidity of the clean air are accurately controlled in a feedback manner.

Referring to FIG. 5, openings DR through which the wafer W and the convey arm enter and exit are formed in the side walls, which face the main wafer convey mechanism 24, of the spinner-type processing units (COT) and (DEV). A shutter (not shown) is attached to each opening DR to prevent particles or contamination from entering the main wafer convey mechanism 124 from each unit.

Note that in the process station 112, as shown in FIG. 2, ducts 152 and 154 are formed to vertically extend in the side walls of the multi-stage units (the oven-type processing units) of the third and fourth groups $G_3$ and $G_4$ adjoining the multi-stage units (the spinner-type processing units) of the first and second groups $G_1$ and $G_2$, respectively. The downflow clean air described above or specific temperature-regulated air is flowed through these ducts 152 and 154. This duct structure stops the heat generated by the oven-type processing units of the third and fourth groups $G_3$ and $G_4$, protecting the spinner-type processing units of the first and second groups $G_1$ and $G_2$ from the influence of the heat.

Also, in this processing system, the multi-stage units of the fifth group $G_5$ can be arranged behind the main wafer convey mechanism 124 as indicated by the dotted lines in FIG. 2. The multi-stage units of this fifth group $G_5$ can be moved along guide rails 156. Therefore, even when the multi-stage units of the fifth group $G_5$ are disposed, a space is formed behind the main wafer convey mechanism 124 by moving these multi-stage units. This allows an easy maintenance work to the main wafer convey mechanism 124 from the behind.

The arrangement and function of the cassette station 110 of this processing system will be described in more detail below with reference to FIGS. 7 and 9.

Figure 9:
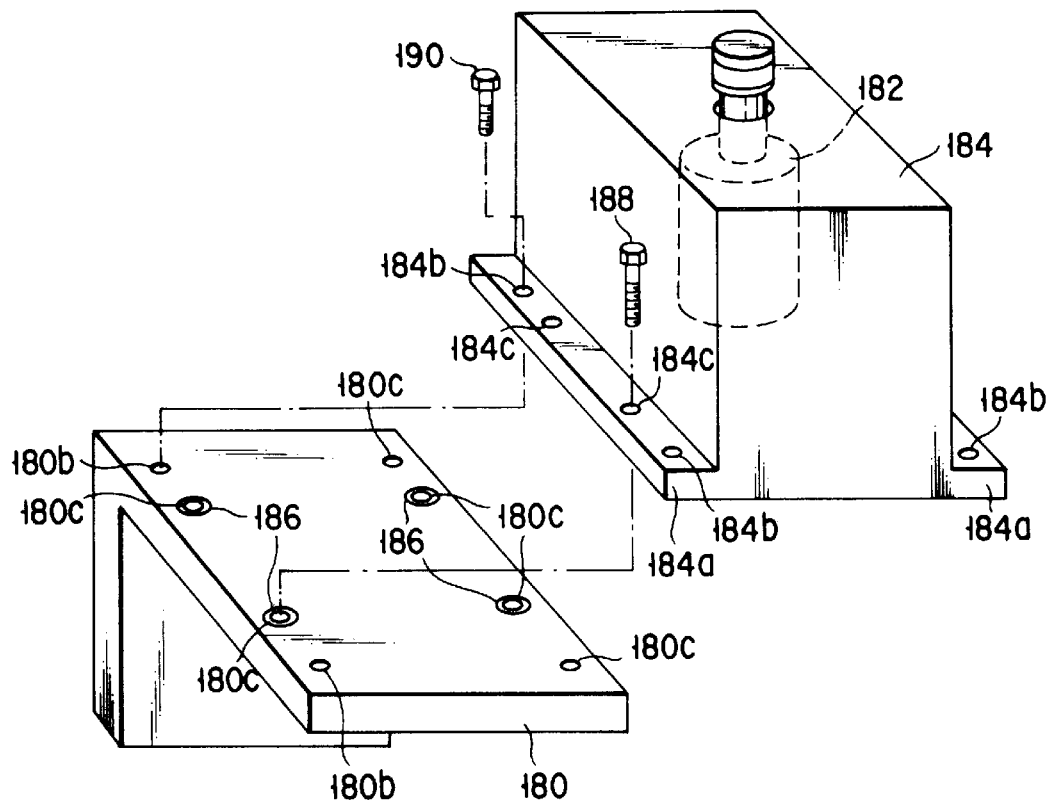
FIG. 9 is a perspective view showing a drive motor support structure in a wafer convey member of the cassette station which employs a parallelism adjusting means.

As illustrated in FIGS. 7 to 9, the wafer convey member 122 of the cassette station 110 includes a pair of tweezers 162 movable (back and forth) in the Y direction on a convey base 160. The convey base 160 is mounted on an elevating base 164 via a rotating shaft 163 so as to be rotatable in the θ direction. The elevating base 164 is so supported as to be vertically movable by a horizontally moving base 166. The horizontally moving base 166 is slidably supported on a guide rail 168 arranged to extend in the X direction. A Y-direction driving unit for moving the tweezers 166 (back and forth) in the Y direction consists of a drive motor and a belt (neither is shown) incorporated into the convey base 160. A rotating unit for rotating the convey base 160 in the θ direction is constituted by a built-in drive motor (not shown) of the elevating base 164. A Z-direction driving unit for vertically moving the elevating base 164 in the Z direction comprises a drive motor and a ball screw (neither is shown) provided in the horizontally moving base 166. An X-direction driving unit for moving the horizontally moving base 166 in the X direction consists of a belt connected to the horizontally moving base 166 and a drive motor (neither is shown).

With the driving mechanisms and the support mechanisms as mentioned above, the wafer convey member 122 can move in the X, Y, Z, and θ directions between each cassette CR on the cassette table 120 and the extension unit (EXT) or the alignment unit (ALIM) of the process station and transfer the wafers W one by one.

The wafer convey member 122 has arcuated wafer centering arm members 170 which extend from the proximal end portions of the tweezers 162 to the both sides. A pair of L-shaped wafer mapping sensor arms 172 and 174 also are attached to the wafer convey member 122. These sensor arms 172 and 174 protrude forward from the front end portion of the convey base 160.

FIG. 7 illustrates the extension unit (EXT) of the process station 112. This extension unit (EXT) has a wafer transfer table 176 on which a plurality of, e.g., three wafer support pins 176a extend vertically in the circumferential direction. As shown in FIG. 8, a circuit board or circuit box 178 which packages or contains a main controller (M/C) and various control circuits (E/C) is arranged below the cassette table 120.

In the wafer convey member 122 as described above, the built-in rotating motor of the elevating base 164 is preferably mounted with its motor rotating shaft being accurately aligned. For this purpose, adjusting screws or bolts for adjusting the parallelism or inclination are used in the motor mounting portion. When aluminum is used as the material of the motor support plate, the plate may be shaved by the tips of the adjusting bolts while the bolts are rotated a number of times, and the resulting shavings may cause dust particles. Although shims (spacers) are sometimes used in place of the adjusting bolts, fine adjustment is difficult to perform when shims are used. This embodiment, therefore, has solved this problem by the use of an arrangement shown in FIGS. 9 and 10.

Referring to FIG. 9, an L-shaped aluminum support plate 180 is fixed in the elevating base 164, and a housing 184 incorporating a drive motor 182 is mounted on this support plate 180. Flanges 184a are formed on the lower end portions of both side surfaces of the housing 184. A plurality of mounting screw holes 184b and through screw holes 184c for parallelism adjustment are formed at appropriate intervals in each flange 184a. Screw holes 180b are formed in the upper surface of the support plate 180 at positions corresponding to the mounting screw holes 184b of the housing 184. Also, circular recesses 180c are formed in the upper surface of the support plate 180 at positions corresponding to the parallelism adjustment screw holes 184c. A stainless-steel plate piece 186 is placed in each recess 180c.

Figure 10:
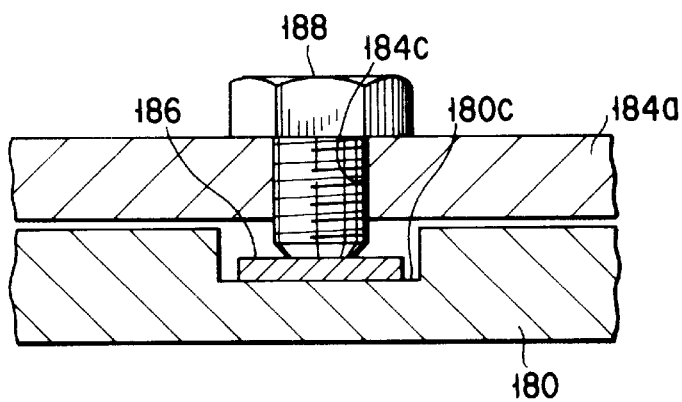
FIG. 10 is a partial sectional view showing the main part of the parallelism adjusting means in FIG. 9.

In this state, the housing 184 is placed on the support plate 180 such that the screw holes 184b and 184c of the housing 184 overlap the corresponding screw holes 180b and recesses 180c of the support plate 180, and bolts 188 for parallelism adjustment are screwed in the screw holes 184c. Consequently, as illustrated in FIG. 10, the tip of each bolt 188 abuts against the stainless-steel plate piece 186. By adjusting the depth to which each bolt 188 is screwed, the parallelism of the housing 184 or of the motor 182 can be adjusted. After this adjustment, mounting bolts 190 are threadably engaged with the mounting screw holes 184b and 180b.

According to this embodiment as mentioned above, the tip of the parallelism adjustment bolt 188 directly abuts against the stainless-steel plate piece 186. Therefore, almost no shavings are produced from the stainless-steel plate piece 186 regardless of the number of times of rotation the bolt 188. Also, the use of the bolts 188 allows more accurate adjustment of the parallelism than when shims are used. This parallelism adjusting means is applicable not only to the wafer convey member 122 but to any given mounting structure.

Figure 11:
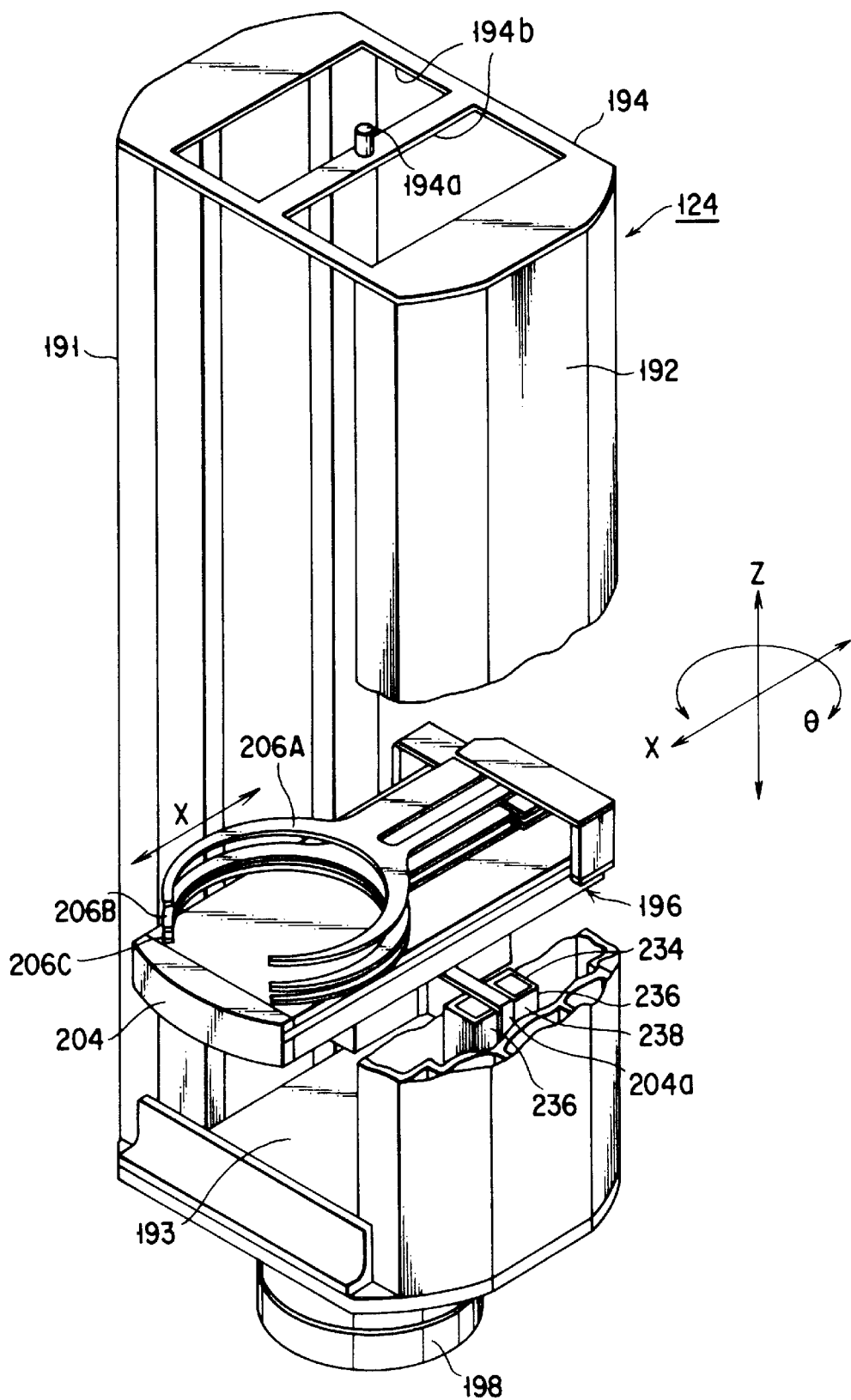
FIG. 11 is a perspective view showing the arrangement of the main part of a main wafer convey mechanism in a process station of the substrate processing system according to the present invention.
Figure 12:
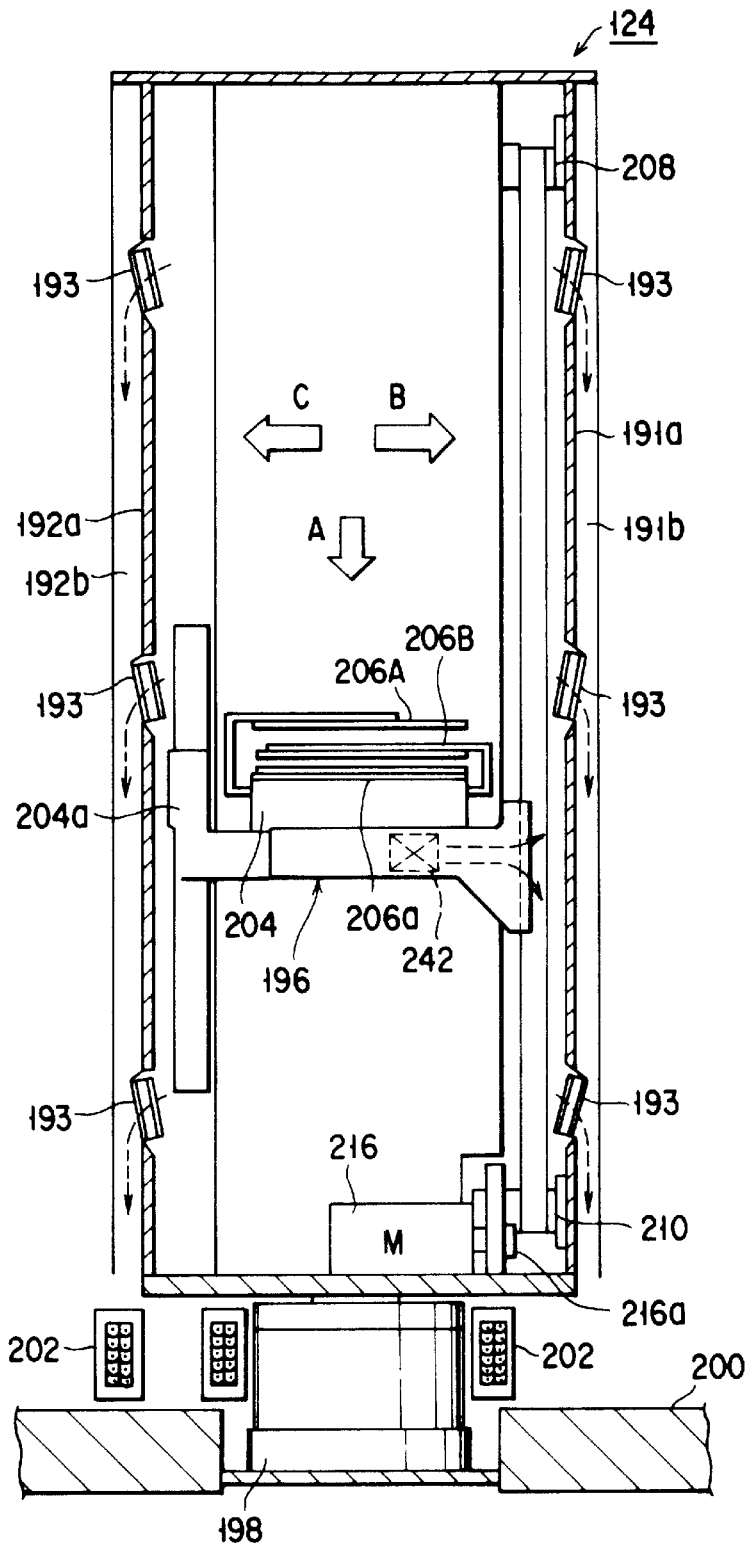
FIG. 12 is a longitudinal sectional view showing the arrangement of the main part of the main wafer convey mechanism of the substrate processing system according to the present invention.
Figure 14:
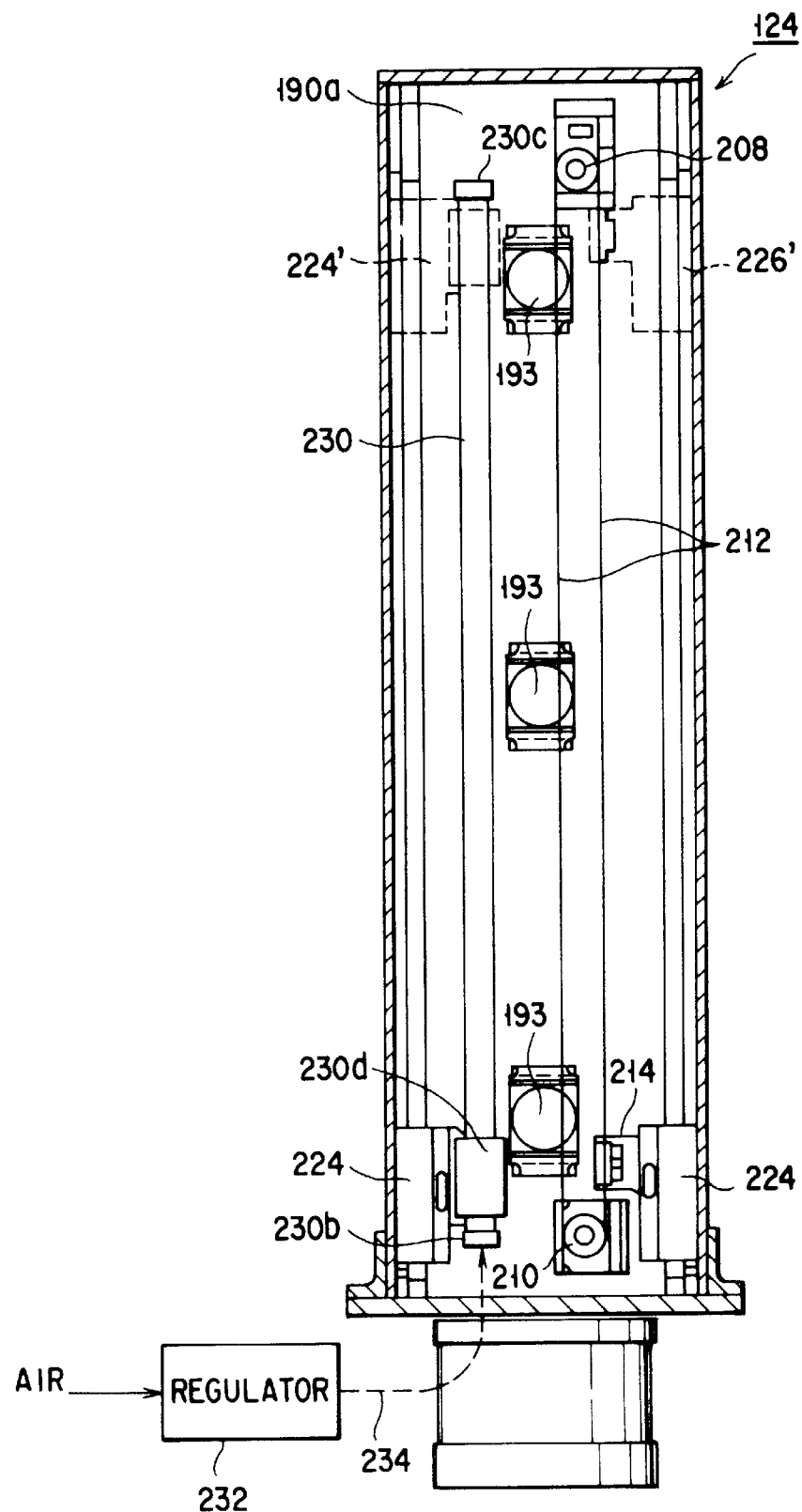
FIG. 14 is a sectional view taken along the direction of an arrow B in FIG. 12.

The arrangement and function of the main wafer convey mechanism 124 in the process station 112 will be described below with reference to FIGS. 11 to 15. FIG. 11 is a schematic perspective view showing the arrangement of the main part of the main wafer convey mechanism 124. FIG. 12 is a longitudinal sectional view showing the arrangement of the main part of the main wafer convey mechanism 124. FIG. 13 is a sectional plan view taken along the direction of an arrow A in FIG. 12. FIG. 14 is a side view of the interior taken along the direction of an arrow B in FIG. 12. FIG. 15 is a side view of the interior taken along the direction of an arrow C in FIG. 12.

As in FIGS. 11 and 12, in the main wafer convey mechanism 124, a wafer convey member 196 is mounted to be movable in the vertical direction (the Z direction) in a cylindrical support member 194 consisting of a pair of opposing vertical walls 191 and 192 connected at the upper ends and the lower ends. The cylindrical support member 194 is connected to the rotating shaft of a rotating motor 198, and is rotated about the rotating shaft, together with the wafer convey member 196, by the rotating force of the motor 198. The rotating motor 198 is fixed to a base plate 200 of the system, and a flexible cable 202 for power supply is wound around the motor 198. Note that the cylindrical support member 194 can also be mounted on some other rotating shaft (not shown) which is rotated by the rotating motor 198. Note also that the vertical is movable range of the wafer convey member 196 is so set that the wafer convey member 196 can access all of the multi-stage units of the first to fourth groups $G_1$ to $G_4$.

The wafer convey member 196 has a plurality of, e.g., three pairs of tweezers 206A, 206B, and 206C movable (back and forth) in the X direction on a convey base 204. Each pair of tweezers 206 can enter and exit into and from a side opening 193 between the two vertical walls 191 and 192. An X-direction moving unit for moving the tweezers 206 in the X direction is constituted by a drive motor and a belt (neither is shown) incorporated in the convey base 204. Note that uppermost one of the three pairs of tweezers, i.e., the tweezers 206A, can be exclusively used to convey cooled wafers. Note also that heat-insulating plates can be arranged between these pairs of tweezers to prevent mutual interference of heat.

As illustrated in FIGS. 12 to 14, a pair of pulleys 208 and 210 are attached to the upper and lower end portions in an almost center on the inner surface of the vertical wall 191. An endless belt 212 is looped around these pulleys 208 and 210. This vertical driving belt 212 is connected to the convey base 204 of the wafer convey member 196 via a belt clamp 214. The lower pulley 210 is connected to a rotating shaft 216a of a drive motor 216 fixed on the bottom of the cylindrical support member 194, thereby constituting a driving pulley. As is clearly shown in FIGS. 13 and 14, a pair of guide rails 216 and 218 extending in the vertical direction are provided on the left and right end portions on the inner surface of the vertical wall 191. Sliders 224 and 226 attached to the ends of a pair of parallel support rods 220 and 222 projecting from the side surface of the convey base 204 are slidably engaged with the guide rails 216 and 218, respectively. With the vertical belt driving mechanism and the vertical slider mechanism as described above, the wafer convey member 196 can be moved up and down by the driving force of the drive motor 216.

As in FIGS. 13 and 14, a rodless cylinder 230 vertically extends between the central portion on the inner surface of the vertical wall 191 and the guide rail 216. A cylindrical movable member 230a loosely fitted on the rodless cylinder 230 is connected to the convey base 204 of the wafer convey member 196 via the horizontal support rod 220. Since the movable member 230a is magnetically coupled with a piston (not shown) movably inserted into the cylinder 230, the wafer convey member 196 and the piston are connected via the movable member 230a so as to be simultaneously movable. A port 230b in the lower end of the cylinder 230 is supplied with compression air from a regulator 232 at a pressure at which a force almost equal to the weight of the wafer convey member 196 is generated in the piston. A port 230c in the upper end of the cylinder 230 is open to the atmosphere.

Since the weight of the wafer convey member 196 is canceled by the lift of the cylinder 230, the wafer convey member 196 can move up at a high speed without being influenced by the gravity. In addition, even if the driving belt 212 is broken, the wafer convey member 196 does not fall due to the gravity since it is held at the position by the lift of the cylinder 230. Consequently, neither the wafer convey member 196 nor the cylindrical support member 190 is damaged.

As shown in FIGS. 11, 13, and 15, sleeves 236 are provided on a central portion and both side portions on the inner surface of the vertical wall 192. Each sleeve 236 accommodates flexible cables 234 which extend in the vertical direction and supply power and control signals to the wafer convey member 196. The opposing outer side surfaces of the two sleeves 236 in the central portion constitute a vertical guide 238 which guides a slider 204a projecting from the side surface of the convey base 204.

As in FIG. 11, a pair of holes 194b are formed on the both sides of a rotation central shaft 194a in the upper surface of the cylindrical support member 194. The downflow clean air from the filter 132 on the ceiling surface flows into the main wafer convey mechanism 124 through these holes 194b. The space in which the wafer convey member 196 vertically moves is kept clean by this downflow clean air.

As shown in FIG. 13, vertical partitions 191a and 192a are formed inside the vertical walls 191 and 192, respectively. Ducts 191b and 192b are defined by the rear surfaces of these partitions 191a and 192a and the vertical walls 191 and 192, respectively. These ducts 191b and 192b communicate with the spaces inside the vertical walls 191 and 192 via a plurality of fans 193 arranged at predetermined intervals in the vertical partitions 191a and 192a. With this arrangement, dust particles produced by the movable members, such as the vertical driving belt 212, the rodless air cylinder 230, and the cables 234, are discharged to the ducts 191b and 192b by the fans 193. Also, as illustrated in FIGS. 12 and 13, in the wafer convey member 196, the internal space of the convey base 204 communicates with the inner spaces of the vertical walls 191 and 192 through the internal holes of the horizontal support rods 220 and 222. With this arrangement, as with the above arrangement, dust particles produced by the tweezers drive motor, the belt, and the like parts incorporated into the convey base 204 also are discharged to the ducts 191b and 192b.

Figure 16:
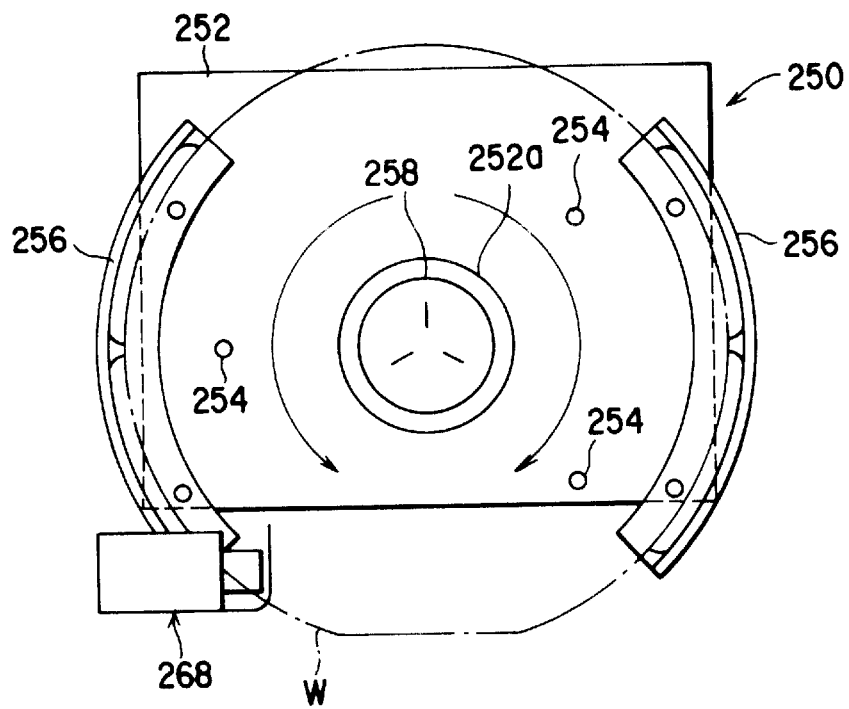
FIG. 16 is a plan view showing the arrangement of the main part of an alignment unit in the process station of the substrate processing system according to the present invention.
Figure 17:
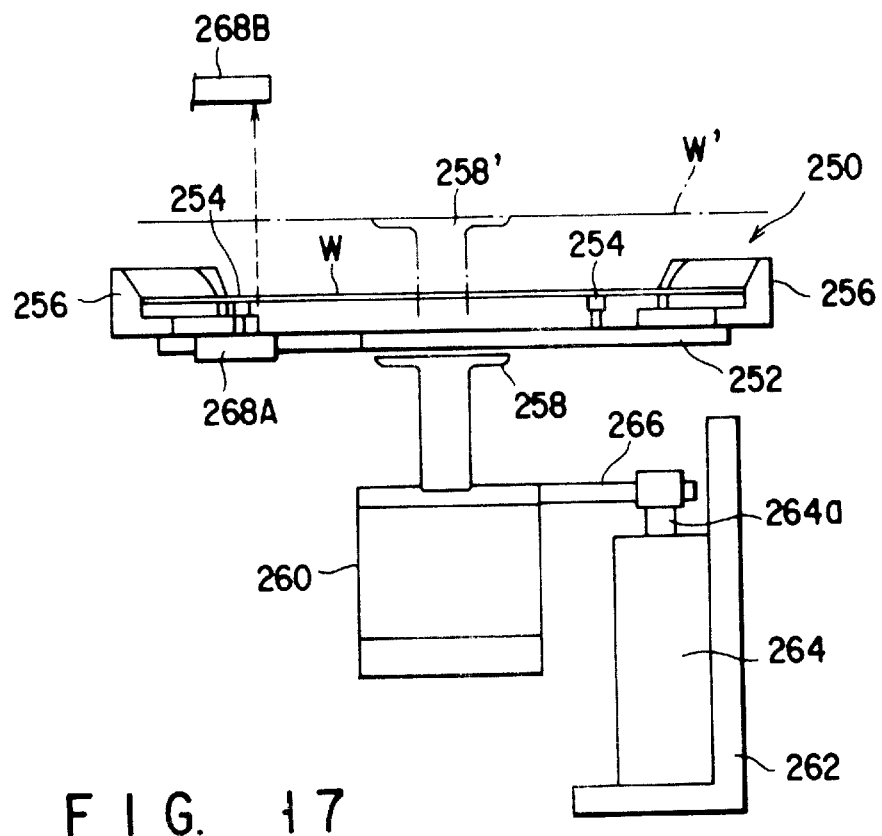
FIG. 17 is a side view showing the arrangement of the main part of the alignment unit in the process station of the substrate processing system according to the present invention.

The arrangement and function of the alignment unit (ALIM) included in the multi-stage units of the third group $G_3$ in the process station 112 will be described below with reference to FIGS. 16 and 17. FIGS. 16 and 17 are plan and side views, respectively, showing details of the arrangement of the main part of the alignment unit (ALIM). This alignment unit (ALIM) has a wafer transfer table 250, as a buffer, on which the wafer W is temporarily placed when it is transferred between the wafer convey member 122 of the cassette station 110 and the wafer convey member 196 of the main wafer convey mechanism 124 of the process station 112. The alignment unit (ALIM) is so designed that centering and orientation flat alignment are possible on the wafer transfer table 250.

As in FIGS. 16 and 17, the wafer transfer table 250 is constituted by arranging, on a horizontal support plate 252, a plurality of, e.g., three support pins 254 for supporting the rear surface of the wafer W and two guide members 256. The guide members 256 are formed to have an arcuated shape and arranged to oppose each other in order to hold the edge of the wafer W. A circular hole 252a is formed in the center of the horizontal support plate 252, through which a spin chuck 258 can move up and down. The upper surface of this spin chuck 258 can hold the wafer W by vacuum suction. The spin chuck 258 is coupled to the rotating shaft of a drive motor 260 disposed under the horizontal support plate 252.

The drive motor 260 is coupled via a horizontal support member 266 to a piston 264a of an air cylinder 264 fixed to a support base 262. When the piston shaft 264a moves up or down, the drive motor 260 and the spin chuck 258 also move up or down together with the piston shaft 264a. A light-emitting portion 268A of an optical sensor 268 for performing orientation flat alignment for the wafer W is attached to one end portion of the guide member 256. Immediately above the light-emitting portion 268A, a light-receiving portion 268B is attached to a support member (not shown) so as to oppose the light-emitting portion 268A. For example, when the wafer convey member 122 of the cassette station 110 accesses the alignment unit (ALIM) to covey the wafer W to a position immediately above the horizontal support plate 252, the spin chuck 258 moves up to receive the wafer W, as indicated by chain lines 258', FIG. 17. The spin chuck 258 is rotated by the drive motor 260, and this rotates the wafer W (on its own axis) in the circumferential direction. When the optical sensor 268 detects the orientation flat of the wafer W, from that position (timing), the spin chuck 258 rotates a predetermined angle and then stops. Consequently, the wafer W is positioned in a predetermined direction, e.g., in a direction in which the orientation flat comes to the front side as in FIG. 16.

After the orientation flat alignment is performed as above, the spin chuck 258 begins moving down and releases the vacuum suction to allow the support pins 254 on the horizontal support plate 252 to support the wafer W. The spin chuck 258 performs centering by making the wafer edge abut against the guide members 256 and moves down to a position lower than the horizontal support plate 252. Thereafter, the spin chuck 258 again moves up and holds the wafer W. The main wafer convey member 196 of the process station 112 inserts any pair of the tweezers 206 between the horizontal support plate 252 and the back side of the wafer W to lift up the wafer W, thereby receiving the wafer W from the wafer transfer table 250.

Figure 18:
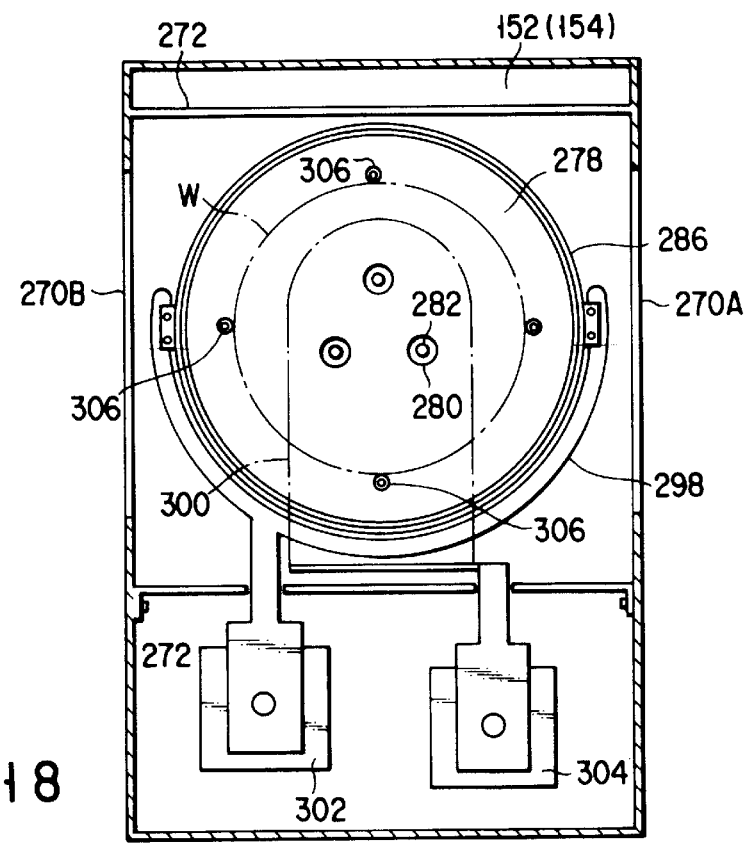
FIG. 18 is a plan view showing the internal arrangement of a baking unit of the substrate processing system according to the present invention.
Figure 19:
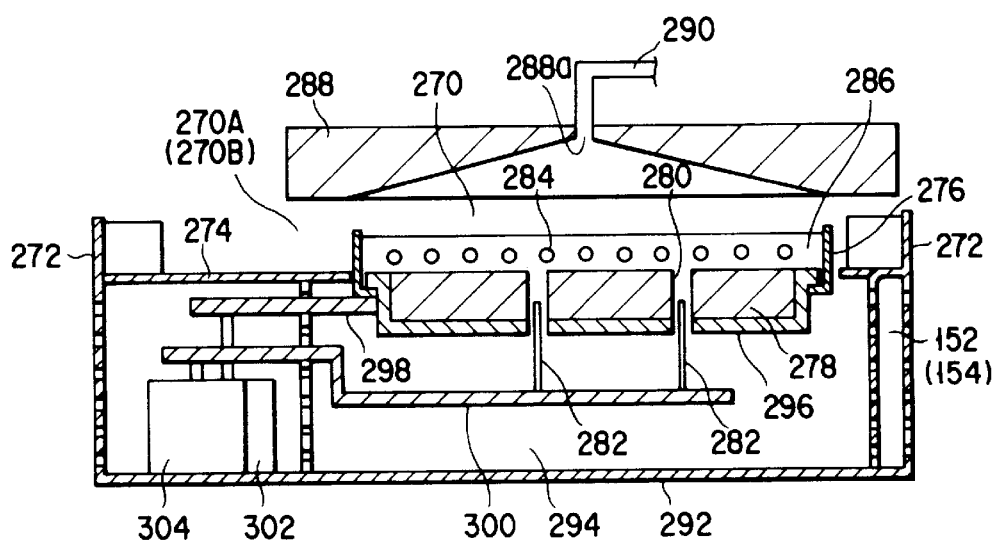
FIG. 19 is a sectional view showing the internal arrangement of the baking unit of the substrate processing system according to the present invention.

The arrangement and function of the baking units (PREBAKE) and (POBAKE) included in the multi-stage units of the third and fourth groups $G_3$ and $G_4$ of the process station 112 will be described below with reference to FIGS. 18 to 21. FIGS. 18 and 19 are plan and sectional views, respectively, showing the internal arrangement of the baking unit of this embodiment. Note that FIG. 18 is a plan view in which a horizontal shielding plate 274 is absent.

A process chamber 270 of this baking unit is formed by side walls 272 and the horizontal shielding plate 274. Openings 270A and 270B are formed in the front surface (facing the main wafer convey mechanism 124) and the rear surface, respectively, of the process chamber 270. A circular hole 276 is formed in a central portion of the shielding plate 274. A disk-like heat plate 278 incorporating a heating unit such as a heater is provided as a susceptor SP in the hole 276.

Three holes 280 are formed in the heat plate 278, and a support pin 282 is loosely inserted into each hole 280. In loading/unloading the wafer W, these support pins 282 protrude or rise from the surface of the heat plate 278 to perform transfer of the wafer W with respect to the waver convey member 194 of the main wafer convey mechanism 124. A shutter 286 is formed around the outer circumference of the heat plate 278. The shutter 286 is made of a ring-like band in which a large number of vent holes 284 are formed at an interval of, e.g., 2°. Normally, this shutter 286 is retracted to a position lower than the heat plate 278. In performing heating, as in FIG. 19, the shutter 286 rises to a position higher than the heat plate 278 to form a ring-like side wall between the heat plate 278 and a cover 288. This permits the downflow clean air which flows from the front side of the apparatus to evenly flow through the vent holes 284. An exhaust port 288a for exhausting the gas produced from the wafer surface during the heating is formed in the center of the cover 288. An exhaust pipe 290 is connected to the exhaust port 288a. This exhaust pipe 290 communicates with the duct 152 (or 154) on the front side of the apparatus (on the main wafer convey mechanism 124 side) or with some other duct (not shown).

A machine room 294 is formed below the shielding plate 274 by the shielding plate 274, the two side walls 272, and a bottom plate 292. This room accommodates a heat plate support plate 296, a shutter arm 298, a support pin arm 300, a shutter arm elevating cylinder 302, and a support pin arm elevating cylinder 304.

As illustrated in FIG. 18, a plurality of, e.g., four wafer guide/support projections 306 are formed on the surface of the heat plate 278 on which the outer peripheral portion of the wafer W is to be placed. FIGS. 20 and 21 are a partial side view and a sectional view, respectively, of the main part for explaining the arrangement and function of the wafer guide/support projections 306. As in FIG. 21, each projection 306 is formed by fixing a trapezoidal-section plate piece 310, which has a conical taper (inclined surface) 310a with a predetermined angle, e.g., 45°, on the heat plate 278 by using a bolt 312 via a flat plate piece 308 having a predetermined thickness D. The flat plate piece 308 extends inside the trapezoidal-section plate piece 310 at least in the radial direction. These plate pieces 308 and 310 are made from, e.g., ceramic. The trapezoidal-section plate pieces 310 constitute a wafer guiding means, and the flat plate pieces 308 constitute a wafer supporting means.

As in FIG. 20, in loading the wafer W, the wafer support pins 282 rise and receive the wafer W from the wafer convey member 194 (not shown). When the wafer support pins 282 move down in this state, i.e., with the wafer W being supported, the outer peripheral portion (the edge) of the wafer W rides on the tapered surface 310a of the trapezoidal-section plate piece 310 of each wafer guide/support projection 306 above the heat plate 278. The edge of the wafer W is immediately dropped to the flat plate pieces 308 along the tapered surfaces 310a and thereby positioned as illustrated in FIG. 21. A distance K between the upper end of the tapered surface 310a of the trapezoidal-section plate piece 310 and the edge of the flat plate piece 308 defines the centering width. This distance K can be set to a desired value as well as the conical taper angle of the trapezoidal-section plate piece 310 and the thickness D of the flat plate piece 308.

As described above, in loading the wafer W, the wafer support pins 282 move down while supporting the wafer W. As a consequence, the wafer W is guided along the tapered surfaces 310a of the trapezoidal-section plate pieces 310 of the wafer guide/support projections 306 and automatically positioned (centered). Therefore, even if slight positioning error is produced during the wafer conveyance done by the wafer convey member 194 of the main wafer convey mechanism 124, the baking unit can absorb (correct) the error, making it possible to accurately position and place the wafer W on the heat plate 278. Additionally, the wafer W is floating from the surface of the heat plate 278 by the thickness D of the flat plate piece 308 of the wafer guide/support projection 306. This prevents dust particles on the surface of the heat plate from adhering to the rear surface of the wafer. Also, the entire wafer surface is uniformly heated by the radiant heat from the heat plate surface.

In this processing system, the cleaning unit (COL) and the extension cleaning unit (EXTCOL) have an arrangement identical to that of the pre-baking unit (PREBAKE) and the post-baking unit (POBAKE), although the processing temperature (the temperature of the susceptor SP) is different. Therefore, the wafer guide/support projections 306 of this embodiment described above can be applied to these units (COL) and (EXTCOL). Note that the wafer guide/support projections 306 can take various shapes other than the one mentioned above. One example is an arcuated shape corresponding to the outer periphery of the wafer W.

The arrangement and function of the adhesion unit (AD) included in the multi-stage units of the third group $G_3$ in the process station 112 will be described below with reference to FIG. 22. FIG. 22 is a sectional view showing the arrangement of the main part of the adhesion unit (AD) according to this embodiment. A processing vessel 320 of this unit (AD) consists of a cylindrical heat plate support member 326 which accommodates a disk-like heat plate 324 as a susceptor SP, and a lid 328 which is placed on the heat plate 324 with a gap 327 and a spacing 327a between them. In a central portion of the lid 328, an HMDS gas inlet 328a is formed. HMDS (hexamethyldisilazane) gas supplied from an HMDS gas supply unit (not shown) through a gas supply pipe 330 is fed into the vessel from the gas inlet 328a.

The lid 328 branches from the vicinity of the gas inlet 328a toward the outside in the radial direction into two upper and lower lid members (328b, 328c), forming a double-lid structure. A gap 328d is formed throughout almost the enter circumference between the outer peripheral portion of the inner lid member 328b, and the inner side wall surface of the outer lid member 328c. Also, a vent hole is formed throughout almost the entire circumference in a connecting portion 328e between the two lid members 328b and 328c. A gap 328f between the lid members 328b and 328c communicates with an exhaust port 331 formed in the outer surface of the lid 328. With this arrangement, the HMDS gas fed from the gas inlet 328a uniformly diffuses in the spacing 327a toward the surrounding and is uniformly exhausted from the gap 328d. Note that the exhaust port 331 is connected to a pump (not shown) through an exhaust pipe 332.

The heat plate 324 is constructed of a metal, e.g., aluminum, having a high thermal conductivity. The wafer W as a target object is placed on the top surface of the heat plate 324. The heat plate 324 incorporates a heater, e.g., a heating resistor, for heating the wafer W, and a temperature sensor. Outside the heat plate 324, a temperature control mechanism (not shown) for controlling the heating temperature of the heater is provided. Through holes 324a are formed at a plurality of, e.g., three portions in the heat plate 324. Vertically movable support pins 326 for transferring the wafer W are loosely inserted into these through holes 324a. In loading/unloading the wafer W, these support pins 326 protrude (rise) to be higher than the upper surface of the hot plate 324 and support the wafer W, thereby performing transfer of the wafer W with respect to the wafer convey member 196 of the main wafer convey mechanism 124.

In the adhesion unit (AD) with the above arrangement, the vessel 320 is not previously set in a predetermined reduced-pressure state in order to allow feed of the HMDS gas. That is, while the gas in the vessel is exhausted from the exhaust port 331 by the pump, the HMDS gas is supplied from the HMDS gas supply unit and fed through the HMDS gas inlet 328a. The wafer W is heated to a predetermined temperature and exposed to an ambient of the HDMS gas which is thus introduced and uniformly diffused. The result is that the surface of the wafer W is given hydrophobic nature. The gas after the processing is exhausted from the exhaust port 311 to the outside of the vessel 320 through the gaps 328d and 328f of the lid 328. When a predetermined time has elapsed, $N_2$ gas, instead of the HMDS gas, is supplied from the gas supply pipe 330. The interior of the vessel 320 is replaced by this $N_2$ gas, and thereby purging is performed.

As described above, in the adhesion unit (AD) of this embodiment, the HMDS gas is introduced into the vessel 320 while the gas in the vessel 320 is exhausted. This prevents a leakage of the HMDS gas from the vessel 320. In addition, the flow rate of the gas exhausted from the exhaust port 311 is set to be higher than the flow rate of the HMDS gas introduced into the vessel 320, so that the outer air flows into the vessel 320 from the gap 327 between the lid 328 and the heat plate support member 326. Consequently, it is feasible to more effectively prevent leakage of the HMDS gas from the gap 327. This makes it unnecessary the use of a sophisticated airtight structure as the vessel 320, with the result that the apparatus cost is greatly decreased. Note that the shapes and positions of the HMDS gas inlet 328a and the exhaust port 331 are not limited to those in this embodiment, so various modifications can be made. As an example, the exhaust port can be formed in the heat plate support member 326, e.g., in the vicinity of the spacing 327a in the upper end portion.

Note also that slide-type units can be detachably arranged above and below the baking unit, the cleaning unit, the extension cleaning unit, the cleaning unit, the adhesion unit, and the alignment unit. This facilitates maintenance work.

The arrangement and function of the interface section 114 of this processing system will be described below with reference to FIGS. 23 and 24. As in FIGS. 23 and 24, a wafer convey member 126 in the interface section 114 includes wafer convey tweezers 342 capable of moving (back and forth) in the X direction on a convey base 340. The convey base 340 is mounted on an elevating base 346 via a rotating shaft 344 so as to be rotatable in the θ direction. The elevating base 346 is so supported by a horizontally moving base 348 as to be movable in the vertical direction (the Z direction). The horizontally moving base 348 is slidably supported on a guide rail 350 which extends in the Y direction. An X-direction moving unit for moving the tweezers 342 in the X direction is constituted by a drive motor and a belt (neither is shown) incorporated in the convey base 340. A rotating unit for rotating the convey base 340 in the θ direction is constituted by a built-in drive motor (not shown) of the elevating base 346. A Z-direction driving unit for moving the elevating base 346 in the Z-direction comprises a drive motor 352 and a ball screw shaft (not shown) provided in the horizontally moving base 348. A Y-direction driving unit for moving the horizontally moving base 348 in the Y direction is composed of a belt connected to the horizontally moving base 348 and a drive motor (neither is shown).

With the driving mechanisms and the support mechanisms described above, the wafer convey member 126 of the interface section 114 can move in the X, Y, Z, and θ directions and transfer the wafers W one by one between the pickup cassette CR and the buffer cassette BR on the front side of the interface section 114, the edge exposure device 128 on the back side, the extension unit (EXT) which belongs to the multi-state units of the fourth group $G_4$ of the process station 112, and a wafer transfer table (not shown) of the adjoining exposure apparatus. A pair of L-shaped sensor arms 354 and 356 projecting forward from the front end portion of the convey base 340 are attached to the wafer convey member 126.

The pickup cassette CR is detachably loaded in the interface section 114 through a door (not shown) on the front panel side of this processing system. The sample semiconductor wafers W are contained in this cassette CR. The buffer cassette BR is a stationary cassette fixed inside the interface section 114. In this processing system or between the processing system and the exposure apparatus, the wafers W are temporarily contained in the cassette BR where necessary (usually for standby or storage). Since the moving stroke of the wafer convey member 126 is relatively large and the tweezers 342 have a relatively large plate thickness, the wafer storage interval (i.e., the wafer storage groove pitch) is set to be larger than that of the common portable cassette CR. For example, the wafer storage interval of the buffer cassette BR is 11 mm, whereas the wafer storage interval of the common cassette CR is 6.35 mm. This allows the tweezers 342 of the wafer convey member 126 to insert and remove the wafer W into and from each wafer storage groove of the buffer cassette BR with no trouble.

The edge exposure device 128 is a spinner-type processing unit which selectively exposes only the edge of the wafer W placed on a spin chuck 128c. An exposure device main body (not shown) is placed in a device housing 128a. An opening 128b with a shutter is formed in the front wall of the device housing 128a to allow entrance and exit of the wafer W and the tweezers 342.

FIG. 24 shows the extension unit (EXT) belonging to the fourth group $G_4$ of the process station 112. This extension unit (EXT) has a wafer transfer table 358 on which a plurality of, e.g., three wafer support pins 358a vertically extend at equal intervals in the circumferential direction.

Wafer conveyance performed when the wafer W undergoes a series of process steps in this processing system will be described below. First, in the cassette station 110, the wafer convey member 122 accesses the cassette CR containing unprocessed wafers on the cassette table 120 and picks up one wafer W from the cassette CR. After picking up the wafer W from the cassette CR, the wafer convey member 122 moves to the alignment unit (ALIM) arranged in the multi-stage units of the third group $G_3$ in the process station 112, and places the wafer W on the wafer table 250 in the unit (ALIM). The wafer W is then subjected to orientation flat alignment and centering on the wafer table 250 as mentioned earlier. Thereafter, the wafer convey member 196 of the main wafer convey mechanism 124 accesses the alignment unit (ALIM) from the side opposite to the side of the wafer convey member 122. The wafer convey member 196 receives the wafer W from the wafer table 250.

In the process station 112, the main wafer convey mechanism 124 first loads the wafer w in the adhesion unit (AD) of the multi-stage units of the third group $G_3$. In this unit (AD), the wafer W undergoes the adhesion process as described previously. When the adhesion process is completed, the main wafer convey mechanism 124 unloads the wafer W from the adhesion unit (AD) and loads the wafer W in the cleaning unit (COL) of the multi-stage units of the third group $G_3$ or the fourth group $G_4$. In this unit (COL) the wafer W is cooled to a set temperature, e.g., 23° C., before resist coating.

After the wafer W is cooled, the main wafer convey mechanism 124 unloads the wafer W from the cleaning unit (COL) and loads it in the resist coating unit (COT) of the multi-stage units of the first group $G_1$ or the second group $G_2$ by using the tweezers 206A. In this resist coating unit (COT), a resist is coated to have a uniform thickness on the surface of the wafer W by a spin coating method. When the resist coating is completed, the main wafer convey mechanism 124 unloads the wafer W from the resist coating unit (COT) and loads it into the pre-baking unit (PREBAKE). In the pre-baking unit (PREBAKE), the wafer W is placed on the heat plate 278 and heated at a predetermined temperature, e.g., 100° C., for a predetermined time. Consequently, the residual solvent is removed by evaporation from the coating film on the wafer W.

After the pre-baking, the main wafer convey mechanism 124 unloads the wafer W from the pre-baking unit (PREBAKE) and loads it into the extension cleaning unit (EXTCOL) of the multi-stage units of the fourth group $G_4$. In this unit (EXTCOL), the wafer W is cooled to a temperature, e.g., 24° C., suitable for the subsequent step, i.e., the edge exposure step performed by the edge exposure device 128. After the cooling, the main wafer convey mechanism 124 transfers the wafer W to the extension unit (EXT) immediately above the unit (EXTCOL) and places the wafer W on the table 358 in this unit (EXT).

When the wafer W is placed on the table 358 of the extension unit (EXT), as in FIG. 24, the wafer convey member 126 of the interface section 114 accesses the unit (EXT) from the side opposite to the side of the main wafer convey mechanism 124, and receives the wafer W. The wafer convey member 126 loads the wafer W in the edge exposure device 128 of the interface section 114, where the edge of the wafer W is exposed. After the edge exposure, the wafer convey member 126 unloads the wafer W from the edge exposure device 128 and transfers it to a wafer reception table (not shown) of the adjoining exposure apparatus. The wafer W may be temporarily stored in the buffer cassette BR before being transferred to the exposure apparatus.

After the entire surface of the wafer W is exposed by the exposure apparatus, the wafer W is returned to the wafer reception table of the exposure apparatus. The wafer convey member 126 of the interface section 114 accesses the wafer reception table and receives the wafer W. As illustrated in FIG. 24, the wafer convey member 126 loads the received wafer W into the extension unit (EXT) of the multi-stage units of the fourth group $G_4$ in the process station 112 and places the wafer on the table 358. As in the case described above, the wafer W may be temporarily stored in the buffer cassette BR of the interface section 114 before being transferred to the process station 112.

When the wafer W is loaded in the extension unit (EXT), the main wafer convey mechanism 124 accesses from the side opposite to the wafer convey mechanism 126 and receives the wafer W. The main wafer convey member 124 loads the wafer W in the developing unit (DEV) of the multi-stage units of the first group $G_1$ or the second group $G_2$. In this developing unit (DEV), the wafer W is placed on the spin chuck and development is performed by supplying a developing solution using, e.g., a spray method, onto the resist film formed on the wafer surface. Thereafter, the developing solution is washed away by supplying a rinsing solution onto the wafer surface.

This development step involves various problems. One of these problems will be described below. Generally, a novolak resin or the like is used as the resist material to be coated on the surface of a target object. On the other hand, as the developing solution it is common practice to use, e.g., an aqueous TMAH solution prepared by dissolving about 2.38% of tetramethylammonium hydroxide (TMAH) in water. The resist film thus made of a resin or the like is water-repellent, so the wettability of the developing solution on the resist film is low. Consequently, the developing solution made of the aqueous TMAH solution is difficult to uniformly spread on the entire surface of the resist film.

Figure 25:
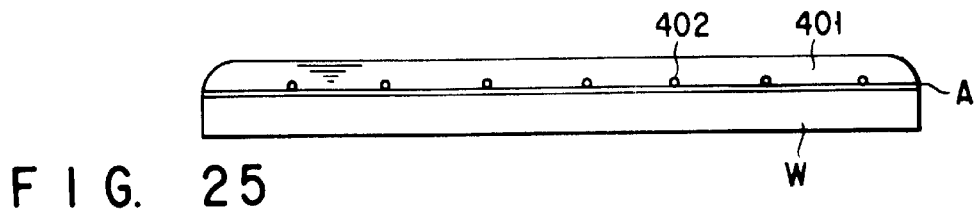
FIG. 25 is a sectional view showing the state in which bubbles are produced in a developing solution.

As shown in FIG. 25, when a resist film A is formed on the surface of the wafer W and a developing solution 401 made of the aqueous TMAH solution is supplied to the surface of the resist film A, bubbles 402 are produced in the developing solution 401 because the affinity (compatibility and wettability) between the two is low. In portions where the bubbles 402 are thus produced, development can no longer be satisfactorily performed, resulting in so-called development defects. A conventionally known method for preventing this is to use a developing solution added with a surfactant, e.g., an aqueous TMAH solution added with an anionic or cationic surfactant.

Figure 26:
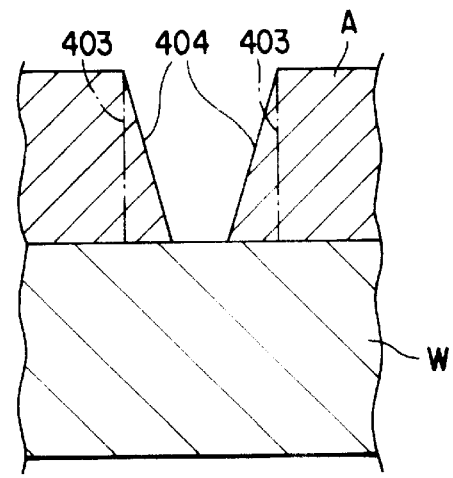
FIG. 26 is a sectional view showing a target object on which a resist pattern is formed.

Unfortunately, in this method of adding a surfactant to a developing solution, the developing characteristics are degraded although the concentration of the developing solution is kept uniform. That is, as depicted in FIG. 26, development of the resist film A is most preferably done such that the end portions of the resist pattern are almost vertical to the surface of the wafer W, as indicated by chain lines 403. However, when a developing solution added with a surfactant is used in development, the surfactant precipitates during the development. The result is that the end portions of the resist pattern are inclined with respect to the surface of the wafer W, as indicated by solid lines 404 in FIG. 26. Also, in actual manufacturing lines, a developing solution is supplied from a common tank provided in a central supply apparatus to individual developing devices. It is therefore impossible to optimize the amount or the type of a surfactant to be added to the developing solution in accordance with the type of resist film or the degree of water repellency.

The present inventors have studied a method capable of imparting hydrophilic nature to the surface of a resist film without affecting the concentration of a developing solution, and provide a processing method in which a hydrophilic film made from a neutral substance is formed on the surface of a resist film coated on a wafer as a target object prior to performing development. The present inventors also provide a method in which a hydrophilic film made from a neutral substance is formed on the surface of a resist film coated on a wafer, and development is performed by supplying a developing solution under conditions by which the contact angle of the developing solution is 50° or smaller.

In either method, the substance forming the hydrophilic film must be a neutral substance which does not react with either the resist film or the developing solution. Examples of this substance are PVA (Polyvinyl Alcohol) and saccharose. This substance is supplied in the form of an aqueous solution onto the resist film. In this case, the viscosity of the aqueous solution is set to preferably less than 10 cp, and more preferably 2 to 3 cp. This is because if the viscosity of the aqueous solution is larger than 10 cp, the thickness of the hydrophilic film formed becomes about 1 μm.

The average thickness of the hydrophilic film is preferably 3000 Å or smaller, and more preferably 2500 Å or smaller due to the following reasons. That is, if the thickness of the hydrophilic film exceeds 3000 Å, the concentration of the developing solution changes significantly on the surface of the resist film, disturbing the uniformity of development. On the other hand, if the thickness of the hydrophilic film is too small, pinholes are produced in the hydrophilic film to result in an unsatisfactory effect. The average thickness of the hydrophilic film is most preferably about 500 Å. Decreasing the thickness of the hydrophilic film as described above makes it possible to form the hydrophilic film with no influence on the concentration of the developing solution supplied to the surface of the resist film.

This hydrophilic film can be formed by either a static coating method in which a wafer which is held horizontally is rotated after an aqueous PVA solution or an aqueous saccharose solution is supplied from the above to the wafer, or a dynamic coating method in which either of the above aqueous solutions is supplied while a wafer held horizontally is being rotated. An example of an apparatus suitable for the formation of the hydrophilic film is a processing apparatus which includes a spin chuck for rotating a wafer while holding the wafer horizontal, and a nozzle for supplying the neutral, hydrophilic solution described above to the surface of a resist film coated on the wafer held by the spin chuck. Note that the nozzle for supplying the solution can be provided in the resist film coating unit and/or the developing unit.

In this processing method, prior to performing the development, it is possible by using the hydrophilic film formed on the surface of the resist film to make the developing solution adapt itself to the surface of the resist film. In particular, development defects can be greatly suppressed by supplying the developing solution under conditions by which the contact angle of the developing solution is 50° or smaller. This method also makes it feasible to perform the development without supplying a larger amount of the developing solution than needed.

Figure 27:
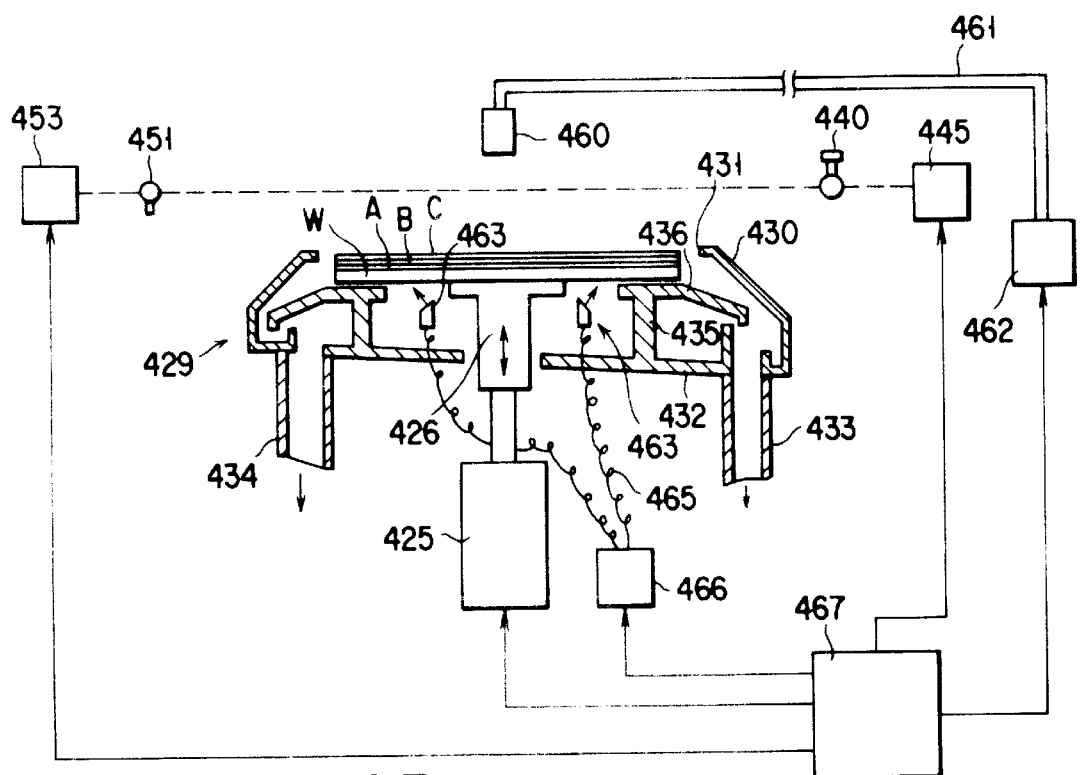
FIG. 27 is a front view showing a developing unit of the substrate processing system according to the present invention.
Figure 28:
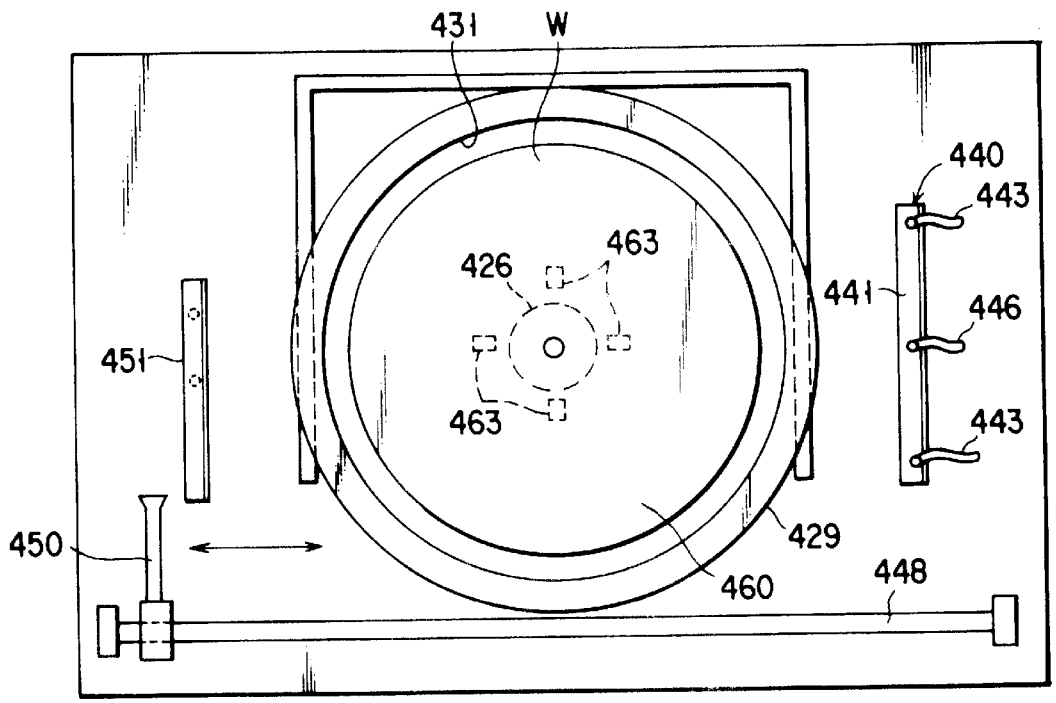
FIG. 28 is a plan view of the developing unit in FIG. 27.

A practical example of the above method will be described below. FIG. 27 is a sectional view of a developing unit used in carrying out the method. FIG. 28 is a plan view of the developing unit in FIG. 27.

As illustrated in FIGS. 27 and 28, in a central portion of the developing unit, there is provided a spin chuck 426 designed to be rotatable and vertically movable by a drive motor 425. The wafer W is held horizontally on the upper surface of the spin chuck 426 by, e.g., vacuum suction. Around the spin chuck 426, an annular cup 429 is so provided as to surround the spin chuck 426. This annular cup 429 is made of a resin or metal and has a function of preventing scattering of a developing solution or a rinsing solution such as cleaning water. The cup 429 has an inclined portion 430 whose diameter decreases from the lower portion to the upper portion. The diameter of an upper opening 431 of the inclined portion 430 is so designed as to be larger than the diameter of the wafer W. A bottom 432 of the cup 429 is formed to be slightly inclined with respect to the horizontal direction. A waste solution pipe 433 is connected to the lowermost portion of the bottom 432. An exhaust pipe 434 for exhausting the internal atmosphere of the cup 429 is also connected to the side opposite to the side of the waste solution pipe 433. On the bottom 432, an annular wall 435 having a smaller diameter than the diameter of the wafer W extends vertically. A straightening plate 436 close to the lower surface of the wafer W held by suction by the spin chuck 426 is disposed on the upper end of the annular wall 435. The peripheral portion of the straightening plate 436 is inclined outward from the upper portion to the lower portion.

Figure 29:
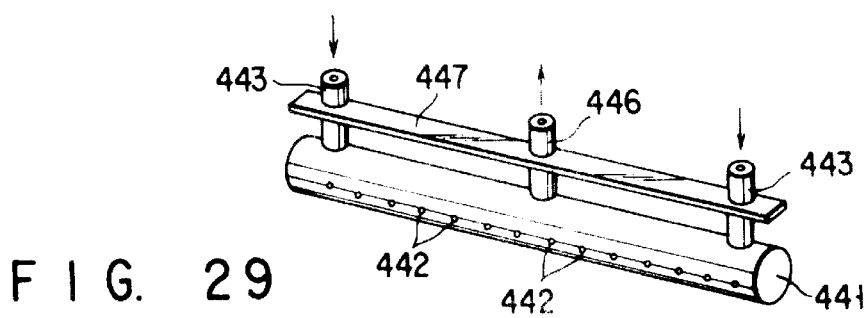
FIG. 29 is a perspective view showing a developing solution supply device in the developing unit of the substrate processing system according to the present invention.
Figure 30:
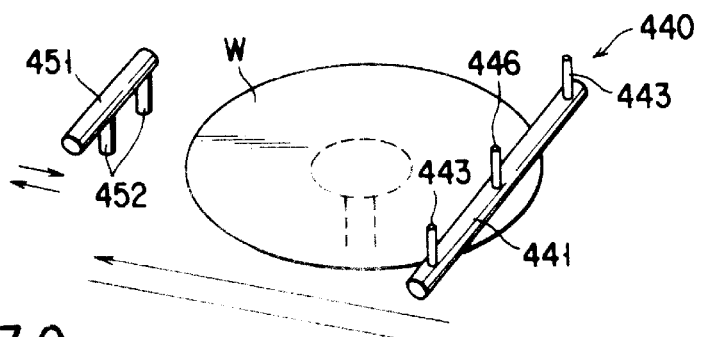
FIG. 30 is a perspective view for explaining the operation of the developing solution supply device in FIG. 29.

A developing solution supply device 440 for supplying a developing solution to the wafer W is arranged on the side of the cup 429. As illustrated in FIGS. 29 and 30, this developing solution supply device 440 has a developing solution header 441 (a developing solution discharge nozzle unit) which is a hollow pipe-like member made of, e.g., vinyl chloride. The length of the developing solution header 441 is slightly larger than the diameter of the wafer W. In the lower surface of the developing solution header 441, a large number of orifices 442 are formed along the axial direction of the header 441. The developing solution header 441 discharges the developing solution supplied into it downward from the orifices 442, thereby supplying the developing solution onto the wafer W. Developing solution supply ports 443 for supplying the developing solution into the developing solution header 441 are formed on the both ends of the header 441. These supply ports 443 are connected to a developing solution source 445 in FIG. 27.

A bubble extraction port 446 is formed on the central portion of the developing solution header 441 to extract bubbles produced when the developing solution is supplied into the header 441 to the outside of the header 441. The developing solution header 441 is supported by a rod-like support arm 447 provided above and parallel to the header 441. As shown in FIG. 28, in front of (below, in FIG. 28) the cup 429, a convey rail 448 for moving the developing solution header 441 back and forth above the wafer W is arranged. A grip arm 450 is movably mounted on the rail 448. The grip arm 450 is moved by a ball-screw, belt-type moving mechanism which is driven by, e.g., an air cylinder or a stepping motor, and grips the support arm 447 to move the developing solution header 441 above the wafer W. Note that the grip arm 450 is constituted by a mechanical chuck mechanism using an air cylinder or the like device, or a vacuum-suction or electromagnetic chuck, and hence can grip, pinch, or suck the support arm 447.

As illustrated in FIG. 27, a rinsing solution header 451 is arranged on the side of the spin chuck 426 opposite to the side on which the developing solution supply device 440 is disposed. This rinsing solution header 451 supplies, e.g., pure water, as a rinsing solution. As shown in FIG. 30, two rinse nozzles 452 are formed below the header 451. As with the developing solution header 441 described above, the rinsing solution header 451 also is designed to be gripped by the grip arm 450 mounted on the convey rail 448 and moved back and forth above the wafer W. After the development, the rinsing solution header 451 discharges the rinsing solution, supplied from a rinsing solution source 453, from the nozzles 452 onto the wafer W.

In the developing unit with the above configuration, a nozzle 460 to be used in forming a hydrophilic film is provided above the spin chuck 426. A solution which is neutral and hydrophilic, which does not react with a resist film, and which completely dissolves in a developing solution, is supplied from a tank 462 to the nozzle 460 through a supply pipe 461. This solution is supplied by a method, such as dropping, downward to the wafer W held by suction by the spin chuck 426. The solution contained in the tank 462 is, for example, an aqueous PVA solution or an aqueous saccharose solution whose viscosity is less than 10 cp, and preferably 2 to 3 cp. Note that the number of the nozzle 460 is not limited to one, as in FIG. 27, but a plurality of such nozzles also can be used. Below the wafer W held by the spin chuck 426, a cleaning water spray nozzle 463 for spraying cleaning water against the lower surface of the wafer W is provided. This cleaning water spray nozzle 463 is so designed as to be able to supply cleaning water from a cleaning water source 466 through a cleaning water supply pipe 465. A controller 467 constituted by, e.g., a microcomputer, controls the whole apparatus including the drive motor 425, the developing solution source 445, the rinsing solution source 453, the tank 462, and the cleaning water source 466.

In the developing unit, the spin chuck 426 first moves up to receive the wafer W from the main wafer convey mechanism 124 and then moves down while holding the wafer W by suction. After the wafer W thus held by suction by the spin chuck 426 is inserted into the cup 429, as shown in FIG. 27, a hydrophilic film B is formed on a resist film A coated on the surface of the wafer W. The formation of this hydrophilic film B is accomplished by either a static coating method or a dynamic coating method described below.

In the film formation done by the static coating method, in the static state before the drive motor 425 is driven, the neutral, hydrophilic solution contained in the tank 462 is supplied from the nozzle 460 downward to the wafer W which is held horizontally by the spin chuck 426 as described above. After a predetermined amount of the neutral, hydrophilic solution is supplied on the resist film A on the wafer W in this static state, the wafer W is rotated by the drive motor 425. Consequently, the solution is spread by the centrifugal force on the entire upper surface of the wafer W, i.e., the entire surface of the resist film A, forming the hydrophilic film B.

In the case of the dynamic coating method, on the other hand, the wafer W is held horizontally by the spin chuck 426 as described above and rotated first at a low speed by the drive motor 425. While the wafer W is thus rotated at a low speed, the neutral, hydrophilic solution contained in the tank 462 is supplied from the nozzle 460 downward to the wafer W and uniformly spread on the resist film A on the wafer W. The wafer W is then rotated at a high speed to spin the excess neutral, hydrophilic solution away from the upper surface of the wafer W by using the centrifugal force. The result is that the hydrophilic film B with a uniform thickness is formed on the resist film A.

In either the static coating method or the dynamic coating method, an aqueous PVA solution or an aqueous saccharose solution whose viscosity is less than 10 cp, and preferably 2 to 3 cp is spread by using the centrifugal force. This makes it possible to form the hydrophilic film B with a very small average thickness of 3000 Å or smaller, and usually 2500 Å or smaller, on the resist film A coated on the surface of the wafer W.

After the hydrophilic film B is formed on the resist film A on the surface of the wafer w as described above, the rotation of the spin chuck 426 is temporarily stopped. The grip arm 450 is then driven to grip the support arm 447 of the developing solution supply device 440, moving the developing header 441 back and forth above the wafer W. At the same time, the developing solution is discharged from the orifices 442 in the lower surface of the developing header 441 such that the developing solution rises on the hydrophilic film B formed on the surface of the wafer W. In this case, the developing solution supplied from the developing solution source 445 enters the header 441 from the supply ports 443 at the two end portions of the developing solution header 441, flows into the hollow portion, and is uniformly discharged from a large number of the small-diameter orifices 442. Bubbles produced at that time or those contained in the developing solution are smoothly extracted from the bubble extraction port 446 formed in the center of the developing solution header 441. This prevents bubbles from being contained in the developing solution coated on the hydrophilic film B on the surface of the wafer W, thereby preventing occurrence of defective development. Note that during the discharge, the developing solution header 441 can be moved back and forth either once or a plurality of times.

Figure 31:
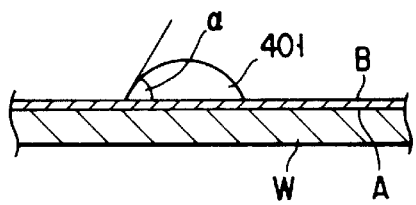
FIG. 31 is a sectional view for explaining a contact angle between a developing solution and a target object.

In performing the development as described above, the developing solution is supplied onto the wafer W under conditions by which the contact angle is 50° or smaller. That is, when the developing solution is supplied onto the wafer W by, e.g., a dropping method, the developing solution, 401 in FIG. 31 forms a semispheric droplet on the hydrophilic film B on the resist film A. A contact angle α of this semispheric droplet of the developing solution 401 (the contact angle α between the edge of the semispheric droplet and the upper surface of the resist film A) changes in accordance with the affinity of the developing solution 401 for the upper surface of the resist film A. The higher the affinity of the developing solution 401 for the resist film A, the smaller the contact angle α; and the lower the affinity, the larger the contact angle. As an example, if the developing solution 401 is directly supplied on the resist film A on the surface of the wafer W without forming the hydrophilic film B, the contact angle α is almost 90° because the resist film A has water repellency. The higher the affinity of the developing solution 401 for the upper surface of the resist film A, the fewer the bubbles 402 explained previously with reference to FIG. 25 are formed in the developing solution 401. In contrast, the lower the affinity of the developing solution 401 for the upper surface of the resist film A, the more the bubbles 402 are formed in the developing solution 401. Accordingly, a large number of development defects take place.

The affinity of the developing solution 401 for the upper surface of the resist film A depends on the condition of the hydrophilic film B. For example, if the developing solution 401 is supplied immediately after the hydrophilic film B is formed on the resist film A on the upper surface of the wafer W by using the static coating method or the dynamic coating method described previously, i.e., when the hydrophilic film B is in a sufficiently wet state, the affinity of the developing solution 401 is high. Therefore, the contact angle α is small, so few development defects take place. On the other hand, if the developing solution 401 is supplied when the affinity of the developing solution 401 for the upper surface of the resist film A is low due to some reason such that the hydrophilic film B is already dried, the contact angle α is large, and many development defects occur accordingly.

Figure 32:
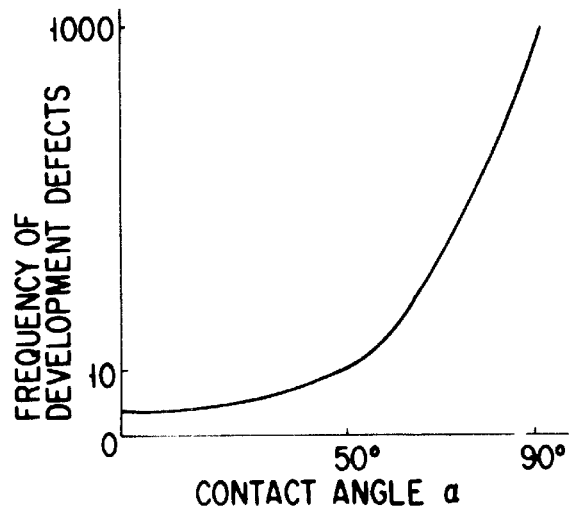
FIG. 32 is a graph showing the relationship between a contact angle $\alpha$ of a developing solution and development defects.

The present inventors investigated the relationship between the contact angle α and the development defects, and the result is shown in FIG. 32. In FIG. 32, the abscissa indicates the contact angle α, and the ordinate gives a logarithmic indication of the frequency of development defects. FIG. 32 shows that the frequency of development defects increased as the contact angle α increased, and that the increasing rate of the frequency of development defects also increased as the contact angle α increased. When the developing solution was supplied under conditions by which the contact angle α was 50° or less, the affinity of the developing solution 401 for the upper surface of the resist film A was very high, and the frequency of development defects was extremely low.

As described above, development is done by forming the hydrophilic film B on the surface of the resist film A coated on the wafer W, supplying the developing solution under conditions by which the contact angle α of the developing solution is 50° or less such that the solution rises on the surface, and leaving the resultant structure to stand for a predetermined time. With this method, it is possible to significantly suppress occurrence of development defects. Note that the contact angle α of the developing solution changes according to the condition of the hydrophilic film B. The conditions required to keep the contact angle α of 50° or smaller are properly determined on the basis of, e.g., the wetness of the hydrophilic film B, the time elapsed from the formation of the hydrophilic film B, on the resist film A to the supply of the developing solution, the ambient temperature and humidity in the developing unit, and the shape and size of the developing unit. These conditions are not always the same for different developing units. Therefore, the conditions necessary to keep the contact angle α of the developing solution 50° or smaller are previously checked for the developing unit to be used, and the developing solution is supplied under the conditions. This allows well development with few defects taking place.

When the development is completed well with few defects taking place as described above, the spin chuck 426 and the wafer W are rotated by the motor 425. By the resulting centrifugal force, the developing solution on the wafer W and the liquid of the hydrophilic film dissolved by the developing solution are spun away. At the same time, the rinsing solution header 451 moves to the center of rotation of the wafer W and supplies the rinsing solution, such as pure water, on the wafer W from the position above the center of the wafer W through the rinsing nozzle 452, thereby washing away the residual developing solution or the like. Also, simultaneously with the supply of the rinsing solution, the cleaning water spray nozzle 463 arranged below the wafer W sprays cleaning water against the lower surface of the wafer W. This washes away the developing solution and the like which are adhered to the lower surface of the wafer W to cause dust particles.

The waste solution thus spun away by the centrifugal force is received by the inner surface of the cup 429, flows along the inclination of the bottom 432, and is discharged from the waste solution pipe 433. The atmosphere containing mist in the cup 429 is evacuated through the exhaust pipe 434 and exhausted to the outside of the system through a mist trap (not shown).

As described above, a hydrophilic film is formed on the surface of a resist film before the developing solution is discharged from the orifices 442 of the developing solution header 441. This permits the developing solution to adapt itself uniformly to the surface of the resist film. In particular, occurrence of development defects can be greatly suppressed by supplying the developing solution under conditions by which the contact angle of the developing solution is 50° or less. Also, the hydrophilic film formed on the surface of the resist film is very thin, i.e., the average thickness of the hydrophilic film is 3000 Å or less, and normally 2500 Å or less. Therefore, the hydrophilic film has almost no effect on the concentration of the developing solution. This makes it possible to maintain the uniformity of development and hence provide high-quality products. Additionally, it is unnecessary to excessively supply a large amount of the developing solution, so the running cost is reduced to result in an economical advantage.

Although the method of the present invention has been described by taking the developing unit as an example in this embodiment, this method can take various forms. For example, the step of forming the hydrophilic film on the surface of the resist film on the wafer can also be performed before the exposure, although in this embodiment the step is done after the exposure and immediately before the development. Also, the nozzle for supplying the neutral, hydrophilic solution to the surface of the resist film of the wafer can be provided in the resist film coating unit, rather than in the developing unit. Additionally, instead of incorporating the nozzle in the developing unit or the resist film coating unit, a hydrophilic film forming means can be separately provided. Furthermore, use of a surfactant, for example, as the substance for forming the hydrophilic film is also feasible.

When the developing step is completed, the main wafer convey mechanism 124 unloads the wafer W from the developing unit (DEV) and loads it into the post-baking unit (POBAKE) of the multi-stage units of the third group $G_3$ or the fourth group $G_4$. In this unit (POBAKE), the wafer W is placed on the heat plate 278 and heated at 100° C. for a predetermined time. Consequently, the resist which is swelled by the developing solution is hardened to improve the chemical resistance.

After the post-baking, the main wafer convey mechanism 124 unloads the wafer W from the post-baking unit (POBAKE) and loads it into any one of the cleaning units (COL) where the wafer W is cooled to room temperature. Thereafter, the main wafer convey mechanism 124 conveys the wafer W to the extension unit (EXT) of the third group $G_3$.

As illustrated in FIG. 7, when the wafer W is placed on the table 176 of the extension unit (EXT), the wafer convey member 122 of the cassette station 110 accesses the unit (EXT) from the side opposite to the main wafer convey mechanism 124 and receives the wafer W. The waver convey member 122 inserts the received wafer W into a predetermined wafer storage groove of the processed wafer storage cassette CR on the cassette table 120.

The component which operates most frequently in this processing system is the main wafer convey mechanism 124 of the process station 112. The wafer convey operation described above is repetitively executed for a number of the wafers W. The main wafer convey mechanism 124 moves between the units of the process station 112 to almost continuously convey the wafers W.

For each unit, the main wafer convey mechanism 124 rotates the cylindrical support member 194 in the θ direction and simultaneously moves the wafer convey member 196 vertically, moving the tweezers 206 back and forth in the X direction to receive the wafer W. The wafer convey member 196 of the main wafer convey mechanism 124 includes the three pairs of tweezers 206A, 206B, and 206C. Therefore, after accessing a desired unit while holding a wafer $W_1$ with, e.g., the first tweezers 206A, the wafer convey member 196 first unloads a processed wafer $W_2$ from the unit with the unused second tweezers 206B, and then loads the wafer $W_1$ into the unit with the first tweezers 206A.

In this processing system, all the multi-stage units in the process station 112 are arranged around the main wafer convey mechanism 124, and the wafer convey member 196 of the main wafer convey mechanism 124 can access all the units only by vertically moving and/or rotating without moving horizontally. This greatly reduces the access time compared to conventional systems. Consequently, the total processing time of the processing steps is significantly shortened to greatly improve the throughput. Also, the convey mechanism is simplified.

Additionally, since all the multi-stage units in the process station 112 are arranged around the main wafer convey mechanism 124, the space (foot print) occupied by the whole system is much decreased in comparison with conventional systems. Accordingly, the clean room cost is lowered. Furthermore, the system of the present invention is advantageous to apply the vertical laminar flow method, has a very high purification efficiency, and necessitates only little installation cost for, e.g., filters.

The arrangement of the individual units in the processing system in the above embodiment is merely an example, so various modifications are possible. As an example, in the multi-stage unit arrangement of the process station 112 in the above embodiment, the two-stage spinner-type processing units are arranged in each of the first and second groups $G_1$ and $G_2$, and the eight-stage oven-type processing units are arranged in each of the third and fourth groups $G_3$ and $G_4$. However, the number of the stages can be any other arbitrary number, and it is possible to arrange both the spinner-type processing unit and the oven-type processing unit or the wafer transfer unit in the same group. It is also possible to add any other processing unit such as a scrubber unit.

Figure 33:
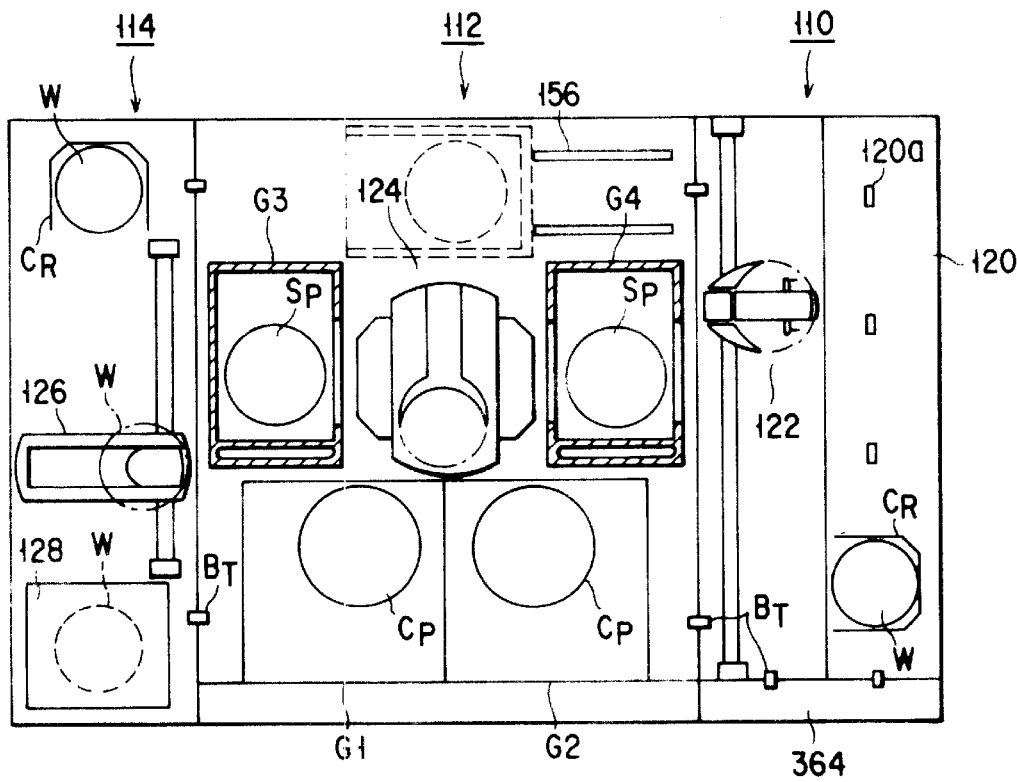

Additionally, as shown in FIGS. 2 and 33, the positions of the cassette station 110 and the interface section 114 arranged on the two sides of the process station 112 can be interchanged. That is, the cassette station 110 and the interface section 114 are detachably connected to the process station 112 by connecting means BT such as bolts. A control panel 364 attached to the front portion of the cassette station 110 is also detachable. This allows an easy change in layout. For example, the exposure apparatus can be arranged on either of the right and left sides in FIG. 2. Also, to accomplish this, it is not necessary to newly perform design or manufacture, resulting in a decrease in the cost.

If no exposure apparatus is installed adjacent to this processing system, the interface section 114 is unnecessary. If this is the case, as shown in FIG. 34, the system can be obtained by connecting the cassette station 110 and the process station 112 alone. In FIG. 34, a cassette table 366 is provided in an open space in the process station 112, e.g., on the rear side of the main wafer convey mechanism 124. In this case, the main wafer convey mechanism 124 can directly access the cassette CR placed on the cassette table 366. It is also possible to arrange the edge exposure device 128 (not shown).

Furthermore, as illustrated in FIG. 35, two cassette stations 110 can be arranged on the both sides of the process station 112. In this case, wafers of different lots can be arranged in the two cassette stations 110 to enable continuous processing, or the wafers can be made flow in either one specific direction or two ways. This improves the productivity and the flexibility to changes in layout.

Figure 36:
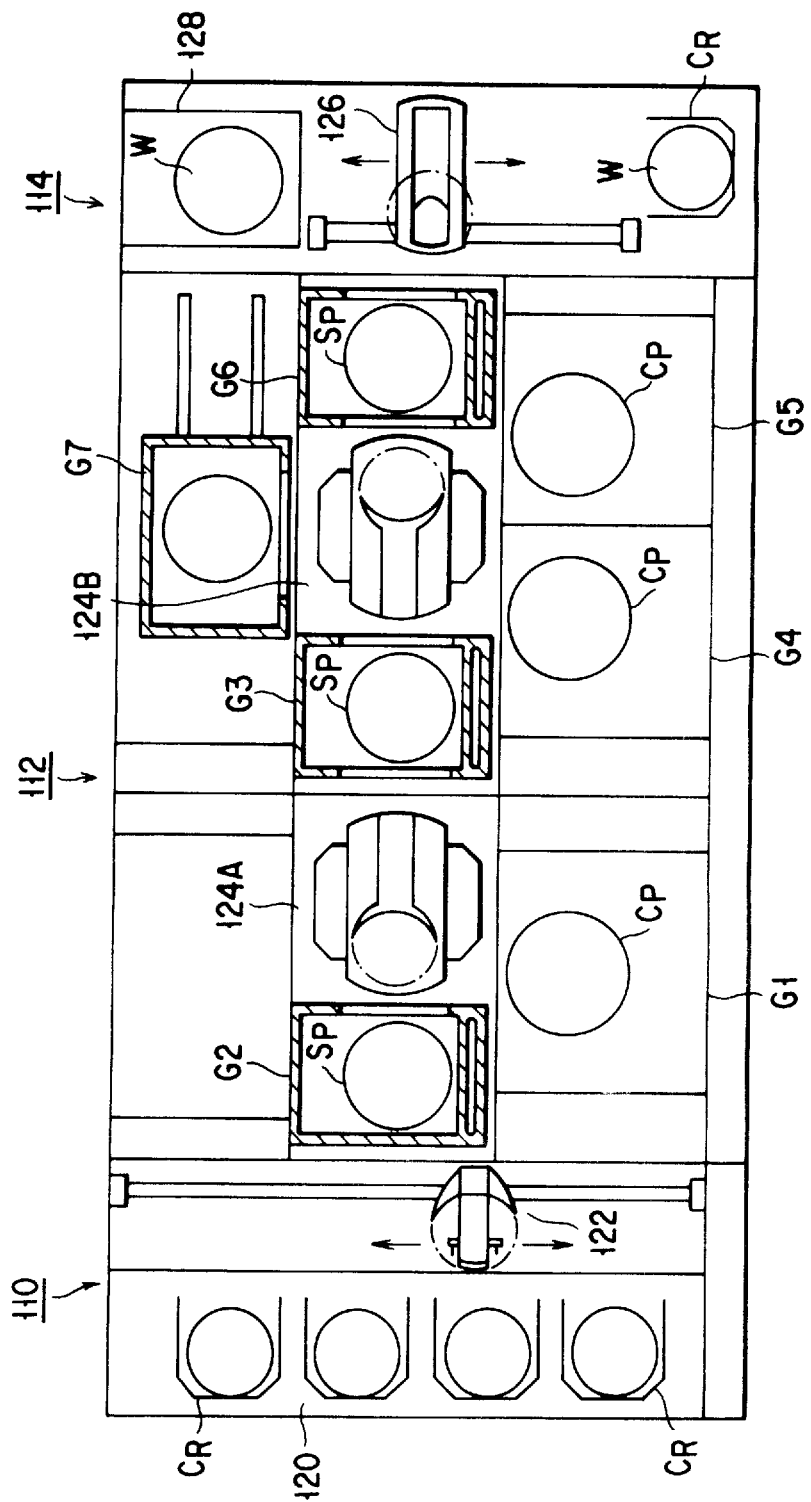

Also, as shown in FIG. 36, it is possible to provide two main wafer convey mechanisms 124A and 124B in the process station 112. Although the space occupied by the system is widened sideways, the space saving is still better than in conventional systems. Since a large number of multi-stage units can be arranged and this improves the throughput, the resulting scale merit is great.

The baking unit in the processing system of the present invention has the target object guiding/supporting means which positions a target object on the susceptor by guiding the edge of the target object along the tapered surface, and supports the target object while the object floats a predetermined distance from the surface of the susceptor. Therefore, when the target object is moved down to the susceptor while being supported by support pins or the like, the edge of the target object is guided to a predetermined position along the tapered surface of the target object guiding/supporting means, and thereby the target object is automatically positioned. Also, since the target object is placed on the susceptor while floating a predetermined distance from the upper surface of the susceptor, dust particles on the upper surface of the susceptor do not adhere to the lower surface of the substrate. Additionally, the overall substrate is uniformly heated by the radiant heat from the upper surface of the susceptor.

Furthermore, the adhesion unit of the processing system of the present invention includes the processing gas feeding means for feeding a processing gas into the vessel and the exhausting means for exhausting the gas from the vessel. In the adhesion unit with this arrangement, while the gas exhausting means is exhausting the gas from the vessel without essentially evacuating the vessel, the processing gas feeding means feeds the processing gas into the vessel. This prevents leakage of the processing gas from the vessel. Consequently, leakage of the processing gas can be prevented more effectively by setting the flow rate of the exhausted gas to be higher than the flow rate of the processing gas to be fed into the vessel, thereby allowing the outer air to flow into the vessel. Moreover, the cost of the apparatus can be decreased since it is not necessary to use an airtight structure as the vessel.

The above embodiment relates to a resist coating/developing system used in the photolithography process in the semiconductor device manufacture. However, the present invention can also be applied to other processing systems, and the target object is not limited to a semiconductor wafer. Examples of the target object to which the present invention is applicable are an LCD substrate, a glass substrate, a CD substrate, a photomask, a printed board, and a ceramic board.

As has been described above, the processing system of the present invention includes a target object conveying means which is vertically movable and rotatable about a rotating shaft, and one or a plurality groups of multi-stage single wafer processing units are arranged around the target object conveying means. The target object conveying means conveys a target object to the individual units in a predetermined order, and a series of process steps are performed for the target object. Consequently, the space occupied by the system is largely decreased. This decreases the cost of the clean room and makes a high conveying or access speed feasible, resulting in an improvement in the throughput.

Additional advantages and modifications will readily occur to those skilled in the art. Therefore, the invention in its broader aspects is not limited to the specific details, representative devices, and illustrated examples shown and described herein. Accordingly, various modifications may be made without departing from the spirit or scope of the general inventive concept as defined by the appended claims and their equivalents.

What is claimed is:

1. A substrate processing system comprising:
    a cassette station on which at least one cassette containing a plurality of objects is placed;
    a process station including a plurality of process chambers for performing processing for the objects, and object conveying means for loading the objects into said process chambers and unloading the objects from said process chambers;
    first object transfer means for transferring the objects between said cassette station and said process station; and
    an interface section including an object waiting region where the objects wait, and second object transfer means for transferring the objects to said process station,
    wherein said process chambers in said process station are arranged around said object conveying means, and
    said object conveying means has a rotating shaft substantially parallel to the vertical direction and can move up and down in the vertical direction along said rotating shaft and rotate about said rotating shaft.

2. A system according to claim 1, wherein said process chambers are oven-type single wafer processing units or spinner-type single wafer processing units which perform processing for the object while holding the object on chucking means.

3. A system according to claim 2, wherein said oven-type single wafer processing units include a baking unit for pre-baking or post-baking the object and an adhesion unit for performing an adhesion process for the object.

4. A system according to claim 1, wherein said interface section has an edge exposure device for exposing an outer peripheral portion of the object.

5. A system according to claim 1, wherein said interface section includes a buffer cassette for temporarily storing the objects.

6. A system according to claim 1, wherein said process chambers are arranged in the form of a plurality of blocks in each of which said process chambers are vertically stacked, each of said blocks being integrally movable in a specific direction.

7. A system according to claim 1, wherein
    said process chambers include a baking unit for pre-baking or post-baking the object, and
    said baking unit having a table on which the object is placed and a support member provided on said table and having a tapered surface, and said support member supporting the object on said tapered surface with the object floating from a surface of said table.

8. A system according to claim 1, wherein
    said process chambers include an adhesion unit for performing an adhesion process for the object, and
    said adhesion unit having processing gas feeding means for feeding a processing gas into said adhesion unit and exhausting means for exhausting gas from said adhesion unit, and said processing gas feeding means feeding the processing gas into said adhesion unit while said gas exhausting means is exhausting gas from said adhesion unit without essentially evacuating said adhesion unit.

9. A system according to claim 1, wherein
    said process chambers include a developing unit for developing the object,
    said developing unit including means for supplying a substance which imparts hydrophilic nature to a film formed on a surface of the object.

10. A substrate processing method comprising the steps of:
    forming a photosensitive film made of a photosensitive material on a surface of a target substrate to be processed;
    forming a hydrophilic film on a surface of said photosensitive film by supplying an aqueous solution, which makes the photosensitive film hydrophilic, to the photosensitive film, said aqueous solution having a viscosity of at most 10 cp; and
    performing a development step which includes applying a developing solution to the photosensitive film having said hydrophilic film formed thereon.

11. A method according to claim 10, wherein the development step includes supplying said developing solution onto said hydrophilic film such that a contact angle of said developing solution with respect to the surface of the photosensitive film is not more than 50°.

12. A method according to claim 10, wherein said aqueous solution comprises one of polyvinyl alcohol and saccharose.

13. A method according to claim 10, wherein the viscosity of said aqueous solution is in a range of from 2 to 3 cp.

14. A method according to claim 10, wherein an average thickness of said hydrophilic film is not more than 3000 Å.

15. A method according to claim 10, wherein an average thickness of said hydrophilic film is not more than 500 Å.

16. A method according to claim 10, wherein said hydrophilic film is formed by supplying said aqueous solution onto said photosensitive film and spreading said aqueous solution on an entire surface of said photosensitive film by rotating the target substrate.

17. A method according to claim 10, wherein said hydrophilic film is formed by supplying said aqueous solution onto said photosensitive film while the target substrate is rotated, thereby spreading said aqueous solution on an entire surface of said photosensitive film.

18. A substrate processing method, comprising the steps of:

forming a photosensitive film made of a photosensitive material on a surface of a target substrate to be processed;

forming a hydrophilic film on a surface of said photosensitive film by supplying an aqueous solution, which makes the photosensitive film hydrophilic, to the photosensitive film, said hydrophilic film having an average thickness of at most 300 nm; and performing a developing step which includes applying a developing solution to the photosensitive film having said hydrophilic film formed thereon.

19. A method according to claim 18, wherein said developing step includes applying said developing solution to said photosensitive film such that a stream of the developing solution makes an angle of at most 50° with the surface of the photosensitive film.

20. A method according to claim 18, wherein said aqueous solution comprises one of polyvinyl alcohol and saccharose.

21. A method according to claim 18, wherein said aqueous solution has a viscosity which is less than 10 cp.

22. A method according to claim 18, wherein said aqueous solution has a viscosity in a range of from 2 cp to 3 cp.

23. A method according to claim 18, wherein said hydrophilic film has an average thickness of at most 50 nm.

* * * * *

UNITED STATES PATENT AND TRADEMARK OFFICE
CERTIFICATE OF CORRECTION

PATENT NO. : 5,826,129
DATED : October 20, 1998
INVENTOR(S) : Keizo Hasebe et al.

It is certified that error appears in the above-identified patent and that said Letters Patent is hereby corrected as shown below:

<u>Title page,</u>
Item [73], Assignee, change "Tokyo Electron Limited, Toyko; Tokyo Electron Kyushu Limited, Tosu, both of Japan" to -- Tokyo Electron Limited, Tokyo, Japan --.

Signed and Sealed this

Sixth Day of September, 2005

JON W. DUDAS
*Director of the United States Patent and Trademark Office*